United States Patent [19]

Ito et al.

[11] Patent Number: 5,349,354
[45] Date of Patent: Sep. 20, 1994

[54] A/D CONVERTER AND CONVERTING METHOD HAVING COARSE COMPARISON AND FINE COMPARISON PERIODS

[75] Inventors: Masao Ito; Shiro Hosotani, both of Hyogo, Japan

[73] Assignee: Mitsubishi Denki Kabushiki Kaisha, Tokyo, Japan

[21] Appl. No.: 29,426

[22] Filed: Mar. 9, 1993

[30] Foreign Application Priority Data

Mar. 11, 1992 [JP] Japan .................................. 4-052270
Mar. 1, 1993 [JP] Japan .................................. 5-039662

[51] Int. Cl.$^5$ ........................ H03M 1/14; H03M 1/36
[52] U.S. Cl. ........................ 341/156; 341/159
[58] Field of Search ............... 341/156, 118, 155, 145, 341/159

[56] References Cited

U.S. PATENT DOCUMENTS 4,903,027 2/1990 Takeuchi et al. .................. 341/156
4,912,470 3/1990 Hosotani et al. ............... 341/156 X

OTHER PUBLICATIONS

"An 8-Mhz CMOS Subranging 8-Bit A/D Converter" by Andrew G. F. Dingwall et al., IEEE Journal of Solid-State Circuits, vol. SC-20, No. 6, Dec. 1985, pp. 1138-1143.

"An 8-bit 20-MS/s CMOS A/D Converter with 50-Mw Power Consumption", by Shiro Hosotani et al., IEEE Journal of Solid-State Circuits, vol. 25, No. 1, Feb. 1990, pp. 167-172.

Primary Examiner—Sharon D. Logan
Attorney, Agent, or Firm—Lowe, Price, LeBlanc & Becker

[57] ABSTRACT

An improved serial-parallel type A/D converter is disclosed herein. A gate circuit 7 applies signals S11' to S14' provided from an encoder 3 only in a fine comparison period to switching circuits 11 to 14 as switching control signals S11 to S14. In the fine comparison period, one switching circuit is turned on, so that a fine comparison voltage is applied to voltage comparators 21 to 23. Since all of the switching circuits are turned off in a coarse comparison period, correct coarse comparison voltage is provided from a reference voltage generating circuit. As a result, a correct conversion in the coarse comparison period can be performed.

22 Claims, 15 Drawing Sheets

A/D CONVERTER AND CONVERTING METHOD HAVING COARSE COMPARISON AND FINE COMPARISON PERIODS

BACKGROUND OF THE INVENTION

1. Field of the Invention

The present invention relates generally to A/D converters and converting methods and, more particularly, to an A/D converter having a coarse period and a fine period in operation. The present invention has particular applicability to A/D converters for video signal processing.

2. Description of the Background Art

Conventionally, a converter which converts an analog signal to a digital signal (hereinafter "A/D converter") is widely used for performing digital signal processing on an analog signal. High speed conversion is also required in A/D converters, since high speed digital signal processing is required, for example, in the field of video signal processing.

As suited for high speed conversion, parallel type and serial-parallel type A/D converters have been conventionally known. Generally, the serial-parallel type A/D converters are operable slower than the parallel type converter. However, since it has small power consumption and can be formed within a small region on a semiconductor substrate, that is, suitable for high integration, they are often used in consumer products for the private sector. One example of the serial-parallel type A/D converter is disclosed in the paper entitled "An 8-MHz CMOS Subranging 8-Bit A/D Converter", in IEEE JOURNAL OF SOLID-STATE CIRCUITS, VOL. SC-20, NO. 6, Dec. 1985. It is pointed out that the present invention is preferably applicable to A/D converters having coarse comparison and fine comparison periods in operation, and particularly to the serial-parallel type A/D converter.

FIG. 11 is a block diagram of a serial-parallel type A/D converter showing the background of the present invention. Referring to FIG. 11, an A/D converter 500 includes a reference voltage generating circuit 1 constituted by resistance elements R connected in series, voltage comparators 21 to 23 comparing a potential of an analog input signal Ai with applied reference voltages, a wiring circuit 2 for transmitting a reference voltage to the voltage comparators 21 to 23, an encoder 3 connected to the outputs of the voltage comparators 21 and 23, a multiplexer 4 for multiplexing data provided from the encoder 3 and a timing signal generator 5.

The resistance elements R constituting the reference voltage generating circuit 1 are connected in series between a predetermined reference potential Vref and ground. A variety of reference voltages are generated through common connection nodes F11 to F43 and C1 to C3 of the resistance elements adjacent to one another. The wiring circuit 2 includes three wirings 41 to 43. The wirings 41 to 43 are connected to the reference voltage generating circuit 1 through switching circuits 11 to 14.

Each of the switching circuits 11 to 14 includes three switching elements. Three switching elements in each of the switching circuits 11 to 14 are simultaneously turned on responsive to the corresponding ones of switching control signals S11' to S14' provided from the encoder 3. In other words, one of the switching circuits 11 to 14 is selectively turned on responsive to the switching control signals S11' to S14'.

The wiring 41 in the wiring circuit 2 is connected to the nodes F11, F21, F31 and F41 through the switching circuits 11 to 14, respectively, each at its first switching element. The wiring 42 is connected to the nodes F12, F22, F32 and F42 through the switching circuits 11 to 14, respectively, each at its second switching element. The wiring 43 is connected to the nodes F13, F23, F33 and F43 through the switching circuits 11 to 14, respectively, each at its third switching element.

FIG. 12 is a schematic diagram of a circuit of one voltage comparator shown in FIG. 11. Referring to FIG. 12, the voltage comparator $2i$ is applicable to each of the voltage comparators 21 to 23. The voltage comparator $2i$ includes a switching circuit $2ia$ of a preceding stage and a comparing circuit $2ib$ of a succeeding stage. The switching circuit $2ia$ is provided with three switching elements 65 to 67 connected together to an output node 68. The switching elements 65 to 67 operate responsive to control signals $\phi 0$ to $\phi 2$ generated from the timing signal generator 5 shown in FIG. 11, respectively.

The switching element 65 receives an analog input signal Ai. The switching element 66 receives a coarse comparison voltage Vrc. The switching element 67 receives a fine comparison voltage Vrf. One coarse comparison voltage Vrc is provided through a corresponding one of the nodes F11 to F43 in the reference voltage generating circuit 1. One fine comparison voltage Vrf is provided through a corresponding one of the nodes F11 to F43 in the circuit 1, and of the switching circuits 11 to 14 and the wiring circuit 2.

The comparing circuit $2ib$ is provided with a capacitor 60 for a voltage comparison, an inverter 63 for determining a comparison result and a switching circuit 64 for initialization in comparison. The switching element 64 is connected across the inverter 63, and operates responsive to the control signal $\phi 0$ provided from the timing signal generator 5 shown in FIG. 11.

FIG. 13 is a timing chart showing an operation of the voltage comparator shown in FIG. 12. Referring to FIG. 13, a period AZ denotes an initialization period (hereinafter "auto zero period") for initializing a potential of the node 61. A period CC denotes a coarse comparison period during which a comparing operation by means of the coarse comparison voltage Vrc is performed. A period FC denotes a fine comparison period during which fine comparison operation is performed by means of the fine comparison voltage Vrf. The control signal $\phi 0$ attains a high level in the auto zero period AZ, and a low level in other periods. The control signal $\phi 1$ attains a high level in the coarse comparison period CC, and attains a low level in other periods. The control signal $\phi 2$ attains a high level in the fine comparison period FC and a low level in other periods.

Therefore, the switching elements 64 and 65 are turned on in the auto zero period, and are turned off in other periods. The switching element 66 is turned on in the coarse comparison period, and is turned off in other periods. The switching element 67 is turned on in the fine comparison period FC, and turned off in other periods.

FIG. 14 is a characteristic diagram showing an input/output characteristic of the inverter shown in FIG. 12. Referring to FIG. 14, an abscissa shows a change of an input voltage V61 of the inverter 63, and an ordinate shows a change of an output voltage V62 of the inverter 63. A curve T shows an input/output characteristic in the case of the switching element 64 being turned off. When the switching element 64 is turned on, the input/output voltages V61 and V62 must exist on a straight line L. Therefore, when the switching element 64 is turned on, the input/output voltages V61 and V62 of the inverter 63 become a voltage $V_{BS}$ (hereinafter "balance voltage") determined by the crossing M of the curve T and the straight line L.

Referring to FIGS. 12 to 14, operation of the voltage comparator 2i will be described. First, in the auto zero period AZ, the switching elements 65 and 64 are turned on, and the switching elements 66 and 67 are turned off, whereby a potential of the analog input signal Ai is applied to a node 68 through the switching element 65. The switching element 64 is turned on, whereby a potential of the input node 61 of the inverter 63 is brought to the foregoing balance voltage $V_{BS}$. As a result, the capacitor 60 is charged by the voltages of the nodes 68 and 61.

In the coarse comparison period, the switching element 66 is turned on, and the other switching element 65, 67 and 64 are turned off. When the switching element 64 is turned off, an input impedance of the inverter 63 becomes infinitive, whereby an electric charge on the side of the node 61 charged in the auto zero period AZ is held. The coarse comparison voltage Vrc is applied to the node 68 through the switching element 66, so that voltage change (Vrc-Ai) at the node 68 is applied to the input node 61 of the inverter 63. The inverter 63 provides an output signal Src showing a coarse comparison result in response to the potential applied to the input node 61. That is, the inverter 63 provides a low level signal Src in case of Vrc>Ai. In case of Vrc<Ai, the inverter 63 provides a high level signal Src. Thus, operation in the coarse comparison period is completed.

The output signals showing the comparison result in the coarse comparison period are applied to the encoder 3 by each of the voltage comparators 21 to 23 shown in FIG. 11. The encoder 3 provides the switching circuits 11 to 14 with the appropriate switching control signals S11' to S14' according to the comparison result in the coarse comparison period CC. Therefore, one of the switching circuits 11 to 14 is selectively turned on, and the fine comparison voltages based on the coarse comparison result are applied to the voltage comparators 21 to 23 through the wiring circuit 2 in the subsequent fine comparison period FC.

The switching control signals S11' to S14' provided from the encoder 3 are as in the following. It is assumed that coarse comparison voltages Vrc1, Vrc2 and Vrc3 are provided from the nodes C1, C2 and C3 in the reference voltage generating circuit 1, respectively. In case of Ai<Vrc1, the switching control signals S11' to S14' which make only the switching circuit 14 turn on are provided. In case of Vrc1<Ai<Vrc2, the switching control signals which make only the switching circuit 13 turn on are provided. In case of Vrc2<Ai<Vrc3, the switching control signals which make only the switching circuit 12 turn on are provided. In case of Vrc3<Ai, the switching control signals which make only the switching circuit 11 turn on are provided. Briefly, the encoder 3 provides the control signals S11' to S14' as shown in Table 1 below to change the operation state of the switching circuits 11 to 14.

TABLE 1

| Case | Output Signals of Voltage Comparators Voltage Comparator | | | Output Signals of Encoder 3 | | | | Switching State of Switching Circuits 11–14 | | | |
|---|---|---|---|---|---|---|---|---|---|---|---|
| | 21 | 22 | 23 | S11' | S12' | S13' | S14' | 11 | 12 | 13 | 14 |
| Ai < Vrc1 | L | L | L | L | L | L | H | OFF | OFF | OFF | ON |
| Vrc1 < Ai < Vrc2 | L | L | H | L | L | H | L | OFF | OFF | ON | OFF |
| (in case of multi-addressing) | (H | L | H) | (H | L | H | L) | (ON | OFF | ON | OFF) |
| Vrc2 < Ai < Vrc3 | L | H | H | L | H | L | L | OFF | ON | OFF | OFF |
| Vrc3 < Ai | H | H | H | H | L | L | L | ON | OFF | OFF | OFF |

In the fine comparison period FC, only the switching element 67 is turned on, and other switching elements 65, 66 and 64 are turned off. Therefore, the fine comparison voltage Vrf generated from the reference voltage generating circuit 1 is applied to the node 68 through the switching element 67. In the auto zero period AZ, since electric charge stored in the node 61 is still held, potential change (Vrf-Ai) at the node 68 is transmitted the input node 61 of the inverter 63. The inverter 63 responds to a potential of the input node 61 to provide an output signal Srf showing a fine comparison result. That is, the inverter 63 provides a low level signal Srf in case of Vrf>Ai and provides a high level signal Srf in case of Vrf<Ai.

Therefore, each of the voltage comparators 21 to 23 shown in FIG. 11 applies to the encoder 3 the output signals showing a comparison result in the fine comparison period FC. The encoder 3 encodes the applied signal to apply data De showing the comparison result in the fine comparison period FC to the multiplexer 4. The multiplexer 4 responds to a control signal $\phi m$ to multiplex data Dc showing the comparison result in the coarse comparison period CC and data Df showing the comparison result in the fine comparison period FC, to provide multiplexed digital data Do. Some examples of the data Dc, Df and Do are shown in FIG. 16.

FIG. 17 is a circuit block diagram of the encoder 3 shown in FIG. 11. Referring to FIG. 17, the encoder 3 includes AND gates 31 to 34, inverters 35 to 37, and a ROM 38. The AND gates 31 to 34 is connected to receive output signals and inverted output signals from the voltage comparators 21 to 23 shown in FIG. 11. The ROM 38 responds to a control signal $\phi e$ from the timing signal generator 5 shown in FIG. 11 to convert output signals from the AND gates 31 to 34 into digital codes "11", "10", "01" and "00" according to a predetermined rule.

Briefly, the encoder 3 shown in FIG. 17 provides digital codes as shown in Table 2 below in the coarse comparison and the fine comparison, respectively.

TABLE 2

| Output Signals of Encoder 3 in Coarse Comparison | Output Signals of Encoder 3 in Fine Comparison | Output Signals Do of Multiplexer 4 |
| --- | --- | --- |
| 11 | 11 | 1111 |
|    | 10 | 1110 |
|    | 01 | 1101 |
|    | 00 | 1100 |
| 10 | 11 | 1011 |
|    | 10 | 1010 |
|    | 01 | 1001 |
|    | 00 | 1000 |
| 01 | 11 | 0111 |
|    | 10 | 0110 |
|    | 01 | 0101 |
|    | 00 | 0100 |
| 00 | 11 | 0011 |
|    | 10 | 0010 |
|    | 01 | 0001 |
|    | 00 | 0000 |

In Table 2, output signals of the multiplexer 4 are also shown. The multiplexer 4 sequentially receives output signals, i.e. digital codes, form the encoder 3 in the coarse comparison and the fine comparison to provide the digital codes in parallel, in other words, provide them as simultaneously converted digital data Do.

After the coarse comparison operation, the output signals S11' to S14' of the AND gates 31 to 34 are provided for controlling the switching circuits 11 to 14 shown in FIG. 11.

FIG. 15 is a circuit block diagram of the timing signal generator shown in FIG. 11. Referring to FIG. 15, the timing signal generator 5 includes dividers 151 and 152, delay circuits 153, 154 and 155 and an AND gate 156. The divider 151 receives a reference timing signal SC in A/D conversion. A chrominance signal subcarrier is used as the signal SC, for example, for A/D conversion in video signal processing.

The AND gate 156 receives each of output signals of the dividers 151 and 152. The output signal of the AND gate 156 is provided as the control signal $\phi 0$. The signal $\phi 0$ is delayed by the delaying circuit 155, and the delayed signal is provided as the control signal $\phi 1$. The output signal of the divider 152 is delayed by the delaying circuits 153 and 154, and the delayed signal is provided as the control signal $\phi 2$. As a result, the control signals $\phi 0$, $\phi 1$ and $\phi 2$ shown in FIG. 13 can be obtained.

FIG. 16 is a timing chart showing conversion operations repeated in the A/D converter shown in FIG. 11. In FIG. 16, conversion operations in three cycles are shown. One conversion operation is performed by an auto zero period AZ1, a coarse comparison period CC1 and a fine comparison period FC1. As a result of the comparison operations in the periods CC1 and FC1, a coarse comparison code Dc1 and a fine comparison code Df1 are sequentially provided as output signal De. The multiplexer 4 provides in parallel the codes Dc1 and Df1 as converted output data Do. Similarly, another conversion operation is performed by periods AZ2, CC2 and FC2. Still another conversion operation is performed by periods AZ3, CC3 and FC3. In FIG. 16, one example of the change of the analog input signal Ai is shown. The abscissa shown in FIG. 16 denotes the passage of time. The output data De of the encoder 3 and the output data Do of the multiplexer 4 are also shown in FIG. 16.

As described above, the switching control signals S11' to S14' provided from the encoder 3 according to the comparison result in the coarse comparison period are continuously provided in the subsequent auto zero period AZ and coarse comparison period CC. For example, as shown in FIG. 16, the switching control signals S11' to S14' based on the comparison result in the coarse comparison period CC1 are continuously provided also in the subsequent auto zero period AZ2 and coarse comparison period CC2 after the fine comparison period FC1. Therefore, one of the switching circuits 11 to 14 designated by the signals S11' to S14' is continuously turned on in the auto zero period AZ2 and the coarse comparison period CC2.

In an A/D converter 500, the encoder 3 provides the switching control signals S11' to S14' which make more than two of the switching circuits 11 to 14 turn on in case of multi-addressing. Therefore, more than two of the switching circuits 11 to 14 are continuously turned on also in the auto zero period AZ2 and the coarse comparison period CC2. When more than two of the switching circuits are turned on, some of the nodes F11 to F43 in the reference voltage generating circuit 1 are shorted through the switching circuits which are turned on and the wiring circuit 2. This causes the level of the coarse comparison voltage generated in the coarse comparison period to change. Therefore, coarse comparison operation in the coarse comparison period CC2 cannot be performed correctly and, consequently, a wrong coarse comparison result is applied from the voltage comparators 21 to 23 to the encoder 3.

For example, an unfavorable level change of the coarse comparison voltage during the coarse comparison period can be explained as follows. FIG. 18 is a graph showing distribution of an output voltage provided from the reference voltage generating circuit 1 in normal operation. Referring to FIG. 18, an abscissa shows positions C1, C2, . . . of the nodes F11, F12, . . . in the reference voltage generating circuit 1 shown in FIG. 11, and an ordinate shows voltage levels at respective nodes. As shown in FIG. 18, in normal operation, that is, when multi-addressing does not occur, the reference voltage generating circuit 1 provides a coarse reference voltage and a fine reference voltage changing on a progressively descending straight line.

On the other hand, in case of multi-addressing, distribution of an output voltage of the reference voltage generating circuit changes as follows. As one example, the case where the potential of the analog input signal Ai applies to the relation Vrc1<Ai<Vrc2 is considered. In this case, the voltage comparators 21, 22 and 23 provide output signals "L", "L" and "H", respectively, in normal operation (see Table 1). However, when multi-addressing occurs, the voltage comparators 21, 22 and 23 provides output signals "H", "L" and "H", respectively, as shown by ( ) in Table 1. As a result, the encoder 3 provides the output signals S11' to S14' of "H", "L", "H" and "L", so that the switching circuits 11 and 13 are turned on, and the switching circuits 12 and 14 are turned off. As a result of the two switching circuits 11 and 13 being conductive, the reference voltage generating circuit 1 generates a reference voltage having voltage distribution shown in FIG. 9.

FIG. 19 is a graph showing distribution of an output voltage of the reference voltage generating circuit 1 in case of multi-addressing. As shown in FIG. 19, in this example, a reference voltage changing successively and uniformly can not obtained, causing false operation during the coarse comparison period.

In addition, the following problems should also be noted. As described above, the fine comparison voltage Vrf is continuously applied to the voltage comparators 21 to 23 in the preceding fine comparison period, the succeeding auto zero period AZ and the coarse comparison period CC. For example, referring to FIG. 16, the fine comparison voltage Vrf1 is continuously applied in the periods FC1, AZ2 and CC2. Similarly, a fine comparison voltage Vrf2 is continuously provided in the periods FC2, AZ3 and CC3.

When the coarse comparison period CC is completed, a new fine comparison voltage Vrf is applied to the voltage comparators 21 to 23. Therefore, when the voltage difference between the new fine comparison voltage Vrf and the old fine comparison voltage Vrf is big, time required for the change of the fine comparison voltage Vrf applied to the voltage comparators 21 to 23 through the wiring circuit 2 becomes long (see the timing chart shown in FIG. 16). This means that the supply of the new fine comparison voltage Vrf to the voltage comparators 21 to 23 is delayed. As a result, the output of the signal showing a fine comparison result from the voltage comparators 21 to 23 is delayed to make the time required for A/D conversion longer.

For example, referring to FIG. 16, when the coarse comparison period CC3 is completed, since a new fine comparison voltage Vrf3 having a big voltage difference (Vrf2-Vrf3) should be applied to the voltage comparators, establishment of the voltage Vrf3 in the voltage comparators is delayed.

SUMMARY OF THE INVENTION

One object of the invention is to provide accurate conversion data from an A/D converter.

Another object of the invention is to provide accurate conversion data in a coarse comparison period of the A/D converter.

Still another object of the invention is to improve a conversion rate of an A/D converter.

An A/D converter according to the present invention includes a reference voltage generating circuit for generating a plurality of coarse reference voltages for defining a plurality of coarse voltage ranges and a plurality of fine reference voltages for defining a plurality of fine voltage ranges, a range detecting circuit for detecting voltage range including an analog input signal potential from the voltage ranges defined by applied reference voltages, a coarse voltage applying circuit for applying a plurality of coarse reference voltages to the range detecting circuit, a fine voltage applying circuit selectively applying fine reference voltages included in the detected coarse range in a plurality of fine reference voltages to the range detecting circuit in response to a detection result based on the coarse reference voltages by the range detection circuit, and a fine voltage application prohibiting circuit prohibiting the application of the fine reference voltages to the range detecting circuit by the fine voltage applying circuit.

In operation, in the coarse comparison period, the fine voltage application prohibiting circuit prohibits the application of the fine reference voltage to the range detecting circuit by the fine voltage applying circuit. Therefore, since the levels of a plurality of coarse reference voltages provided from the reference voltage generating circuit are not affected by the outputs of a plurality of fine reference voltages, detection of the coarse voltage range by the range detecting circuit can accurately be performed, whereby accurate converted data is obtained.

In another aspect according to the present invention, the A/D converter further includes an intermediate wiring circuit connected between the fine voltage applying circuit and the range detecting circuit to transmit the fine reference voltage provided from the fine voltage applying circuit to the range detecting circuit, and a follower circuit which makes the intermediate wiring circuit follow the analog input signal potential.

In operation, while the range detecting circuit detects the coarse voltage range, the intermediate wiring circuit is made to follow the analog input signal potential by the follower circuit. Therefore, since the next fine reference voltage supplied from the intermediate wiring circuit to the range detecting circuit is changed from the analog input signal potential, time required for the application of the intermediate reference voltage to the range detecting circuit is shortened, whereby an A/D conversion rate is improved.

In accordance with still another aspect of the present invention, an A/D converter includes a reference voltage generating circuit for generating a plurality of coarse reference voltages for defining a plurality of coarse voltage ranges and a plurality of fine reference voltages for defining a plurality of fine reference ranges, a circuit for sampling an input analog voltage, a coarse range detecting circuit responsive to the sampled voltage for providing a coarse comparison result code corresponding to a coarse voltage range including the input analog voltage during a coarse comparison period, a fine range detecting circuit responsive to the sampled voltage and the coarse comparison result code for providing a fine comparison result code corresponding to a fine voltage range including the input analog voltage in a fine comparison period, a fine voltage applying circuit responsive to the coarse range detecting circuit for applying to the fine range detecting circuit a fine reference voltage included in the coarse voltage range detected by the coarse range detecting circuit only in the fine comparison period, and a circuit responsive to the coarse comparison result code and the fine comparison result code for providing a digital code corresponding to the input analog voltage.

In operation, the fine voltage applying circuit applies a fine reference voltage to the fine range detecting circuit only in the fine comparison period. Therefore, since the levels of a plurality of coarse reference voltages are not affected by multi-addressing in the coarse comparison period, detection of the coarse voltage range by the coarse range detecting circuit can accurately be performed, whereby accurate converted data is obtained.

In accordance with a further aspect of the present invention, an A/D converter includes a reference voltage generating circuit for generating a plurality of coarse reference voltages for defining a plurality of coarse voltage ranges and a plurality of fine reference voltages for defining a plurality of fine voltage ranges. Each of the plurality of coarse voltage ranges includes a corresponding group of the plurality of fine voltage ranges. The A/D converter further includes a plurality of voltage comparators each having first, second and third input nodes. Each of the plurality of voltage comparators, in a sampling period, samples an input analog voltage through the first input node, in a coarse comparison period, compares the sampled voltage with a voltage applied through the second input node to provide a coarse comparison result signal, and in a fine comparison period, compares the sampled voltage with a voltage applied through the third input node to provide a fine comparison result signal. The A/D Converter further includes an encoder for converting the coarse comparison result signal and fine comparison result signal provided from the plurality of voltage comparators into an upper bit signal and a lower bit signal according to a predetermine rule, to sequentially provide the converted signals, a multiplexer for providing in parallel the upper bit signal and lower bit signal from the encoder, a switching circuit responsive to the coarse comparison result signal for selectively applying to the plurality of voltage comparators some of the plurality of fine reference voltages corresponding to the coarse comparison result, and a coarse comparison result transmitting control circuit for transmitting the coarse comparison result signal to the switching circuit only in the fine comparison period.

In operation, the coarse comparison result transmitting control circuit transmitting coarse comparison result signals provided from the plurality of voltage comparators to the switching circuit only in the fine comparison period. The switching circuit thus selectively applies a fine reference voltage to the plurality of voltage comparators only in the fine comparison period. Since the levels of the plurality of coarse reference voltages are not affected by multi-addressing in the coarse comparison period, coarse comparison operation by the plurality of voltage comparators can accurately be performed, whereby accurate converted data is obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
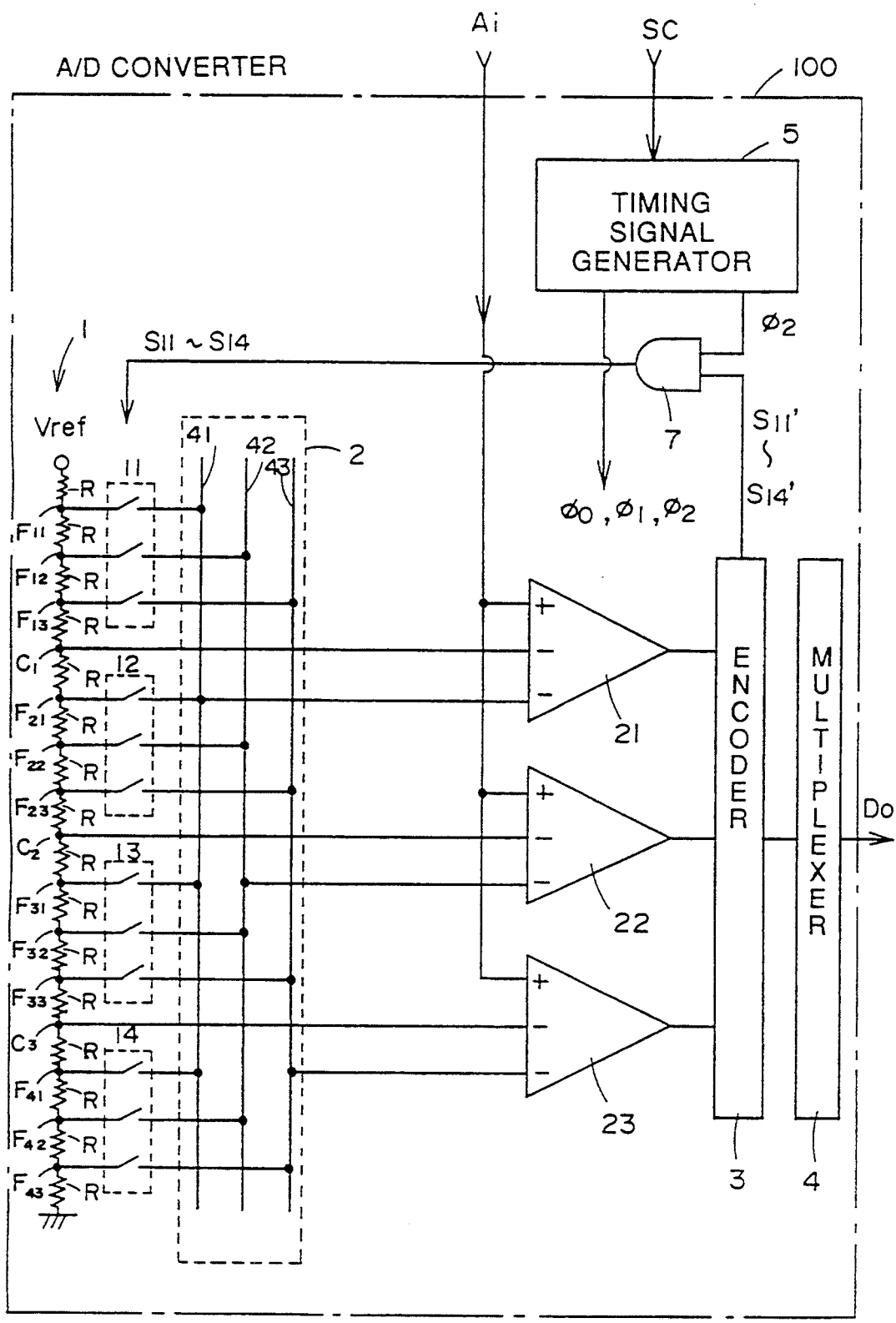
FIG. 1 is a circuit block diagram of an A/D converter showing one example of the present invention.

Referring to FIG. 1, an A/D converter 100 includes a newly added gate circuit 7. The gate circuit 7 receives a control signal $\phi 2$ generated from a timing signal generator and switching control signals S11' to S14' provided from an encoder 3. The gate circuit 7 responds to the control signal $\phi 2$ to provide new switching control signals S11 to S14 for switching circuits 11 to 14. The switching circuits 11 to 14 each operate responsive to the new switching control signals S11 to S14, respectively. Since other circuit structures in the A/D converter 100 are essentially the same as those of a conventional A/D converter 500 shown in FIG. 11, the explanation will not be given.

Figure 2:
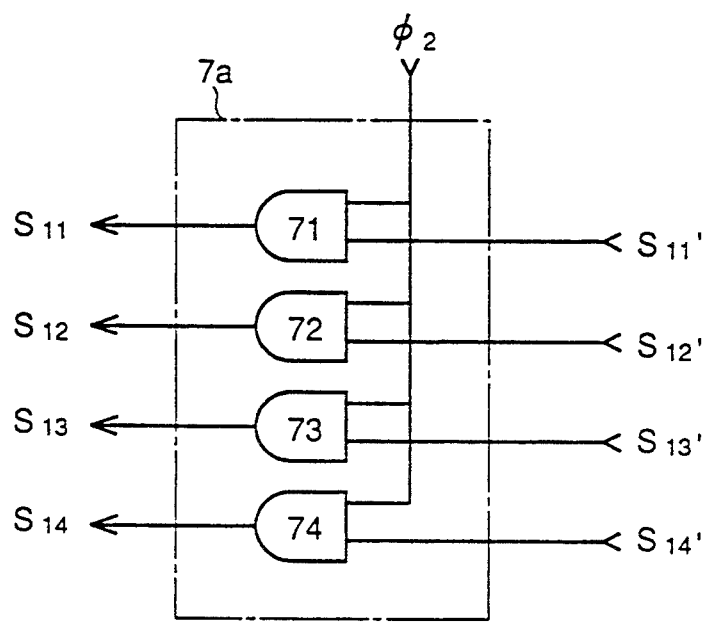
FIG. 2 is a logic circuit diagram showing one example of a gate circuit 7 shown in FIG. 1.

FIG. 2 is a logic circuit diagram showing one example of the gate circuit 7 shown in FIG. 1. Referring to FIG. 2, a gate circuit 7a includes AND gates 71 to 74, each having first and second input nodes. The AND gates 71 to 74 receive a control signal $\phi 2$ from the timing signal generator 5 through respective first input nodes. The AND gates 71 to 74 receive switching control signals S11' to S14', respectively, from the encoder 3 through respective second input nodes. The AND gates 71 to 74 apply output signals S11 to S14 to the switching circuits 11 to 14.

In operation, when applied the control signal $\phi 2$ at a high level, the AND gates 71 to 74 transmit the switching control signals S11' to S14' as the output signals S11 to S14. When the control signal $\phi 2$ at a low level is applied, the switching control signals S11' to S14' are not transmitted.

Figure 3:
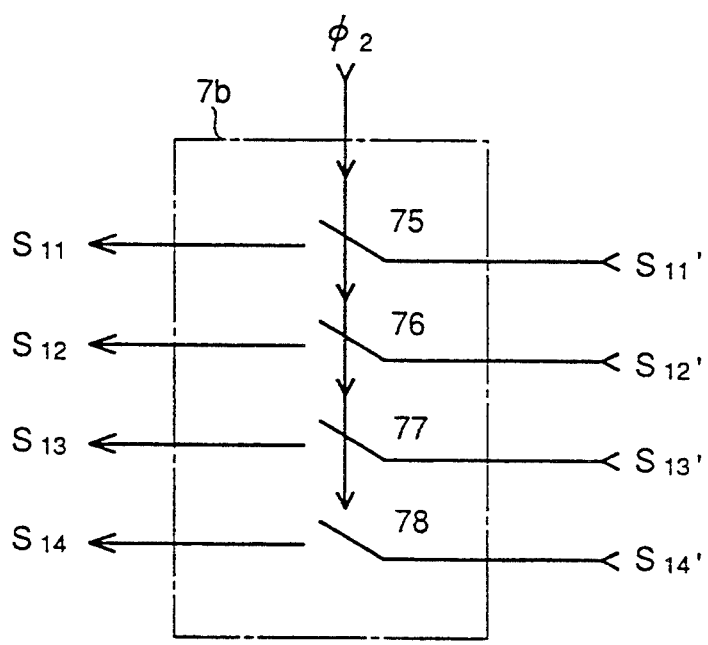
FIG. 3 is a circuit diagram showing another example of the gate circuit 7 shown in FIG. 1.

FIG. 3 is a schematic diagram showing another example of the gate circuit 7 shown in FIG. 1. Referring to FIG. 3, a gate circuit 7b includes switching elements 75 to 78 which are rendered conductive in response to the control signal $\phi 2$. The switching elements 75 to 78 are connected so as to receive the switching control signals S11' to S14'.

In operation, when the control signal $\phi 2$ at a high level is applied, the switching elements 75 to 78 are rendered conductive, so that the switching control signals S11' to S14' are transmitted as the switching control signals S11 to S14. When the control signal $\phi 2$ at a low level is applied, the switching elements 75 to 78 are turned off, so that the switching control signals S11' S14' are not transmitted.

Figure 4:
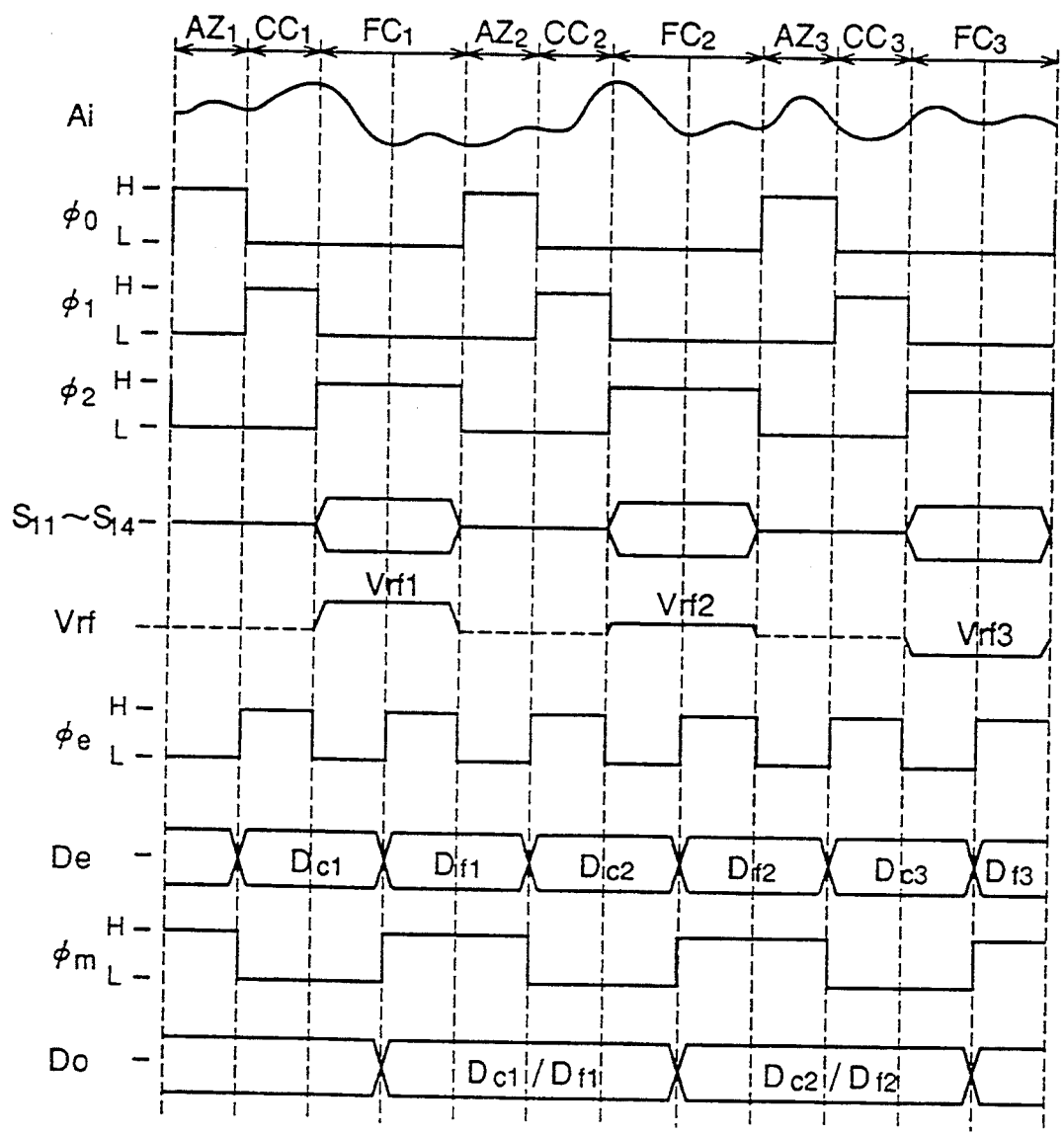
FIG. 4 is a timing chart showing an operation in the A/D converter of FIG. 1.

FIG. 4 is a timing chart showing the operation in the A/D converter shown in FIG. 1. Referring to FIGS. 1 and 4, operation of the A/D converter 100 will be described hereinafter. In the following description, advantages obtained by the provision of the gate circuit 7 will especially be given instead of the basic conversion operation, since it is similar to that of the A/D converter 500 shown in FIG. 11.

The control signal $\phi 2$ generated from the timing signal generator 5 attains a high level in a fine comparison period FC, and attains a low level in other periods AZ and CC. Therefore, the gate circuit 7 provides the switching control signals S11' to S14' provided from the encoder 3 as new switching control signals S11 to S14 only in the fine comparison period FC. Consequently, any one of the switching circuits 11 to 14 is turned on in the fine comparison period FC. In other periods, that is, auto zero period AZ and coarse comparison period CC, all of the switching circuits 11 to 14 are turned off in response to the signals S11 to S14 supplied from the gate circuit 7. Therefore, a fine comparison voltage Vrf is not applied to voltage comparators 21 to 23 in the auto zero period AZ and the coarse comparison period CC.

Referring to FIG. 4, for example, the switching control signals S11 to S14 are applied to the switching circuits 11 to 14 only in the fine comparison periods FC1, FC2 and FC3. Therefore, the fine comparison voltage determined by any one of the activated signals of the switching control signals S11 to S14 is applied to the voltage comparators 21 to 23 in each of the fine comparison periods FC1, FC2 and FC3. In other periods, the periods AZ1, CC1, AZ2, CC2 etc., since all of the switching circuits 11 to 14 are turned off, the fine comparison voltage Vrf is not applied to the voltage comparators 21 to 23.

Figure 11:
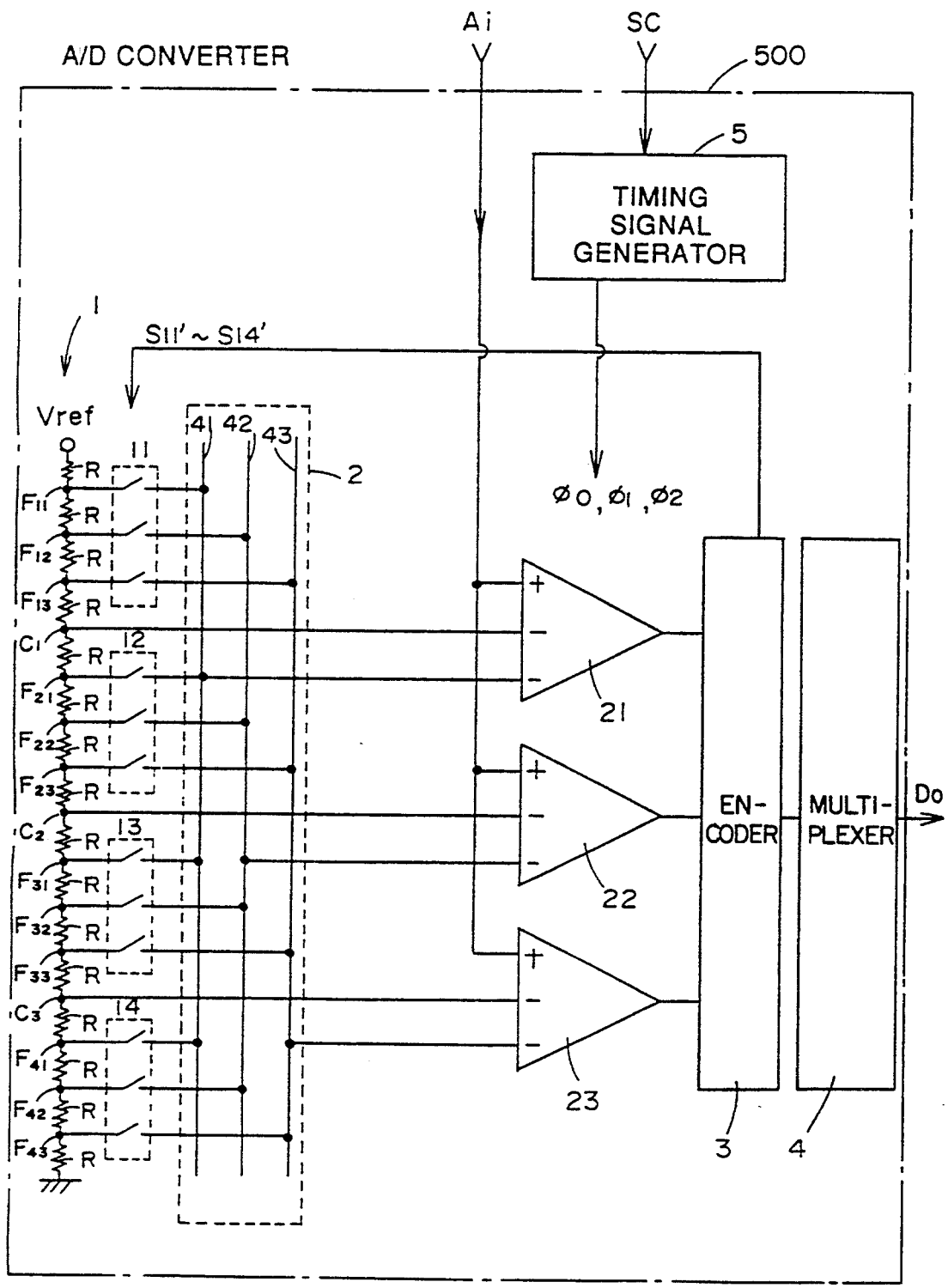
FIG. 11 is a circuit block diagram of an A/D converter showing a background of the invention.
Figure 12:
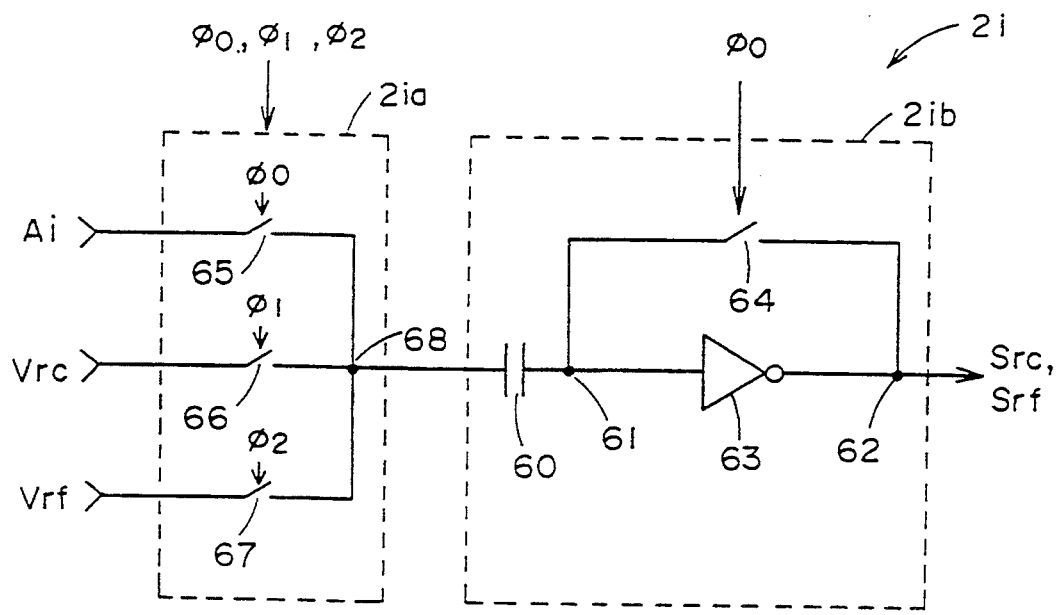
FIG. 12 is a schematic diagram of a circuit of one voltage comparator shown in FIG. 11.
Figure 13:
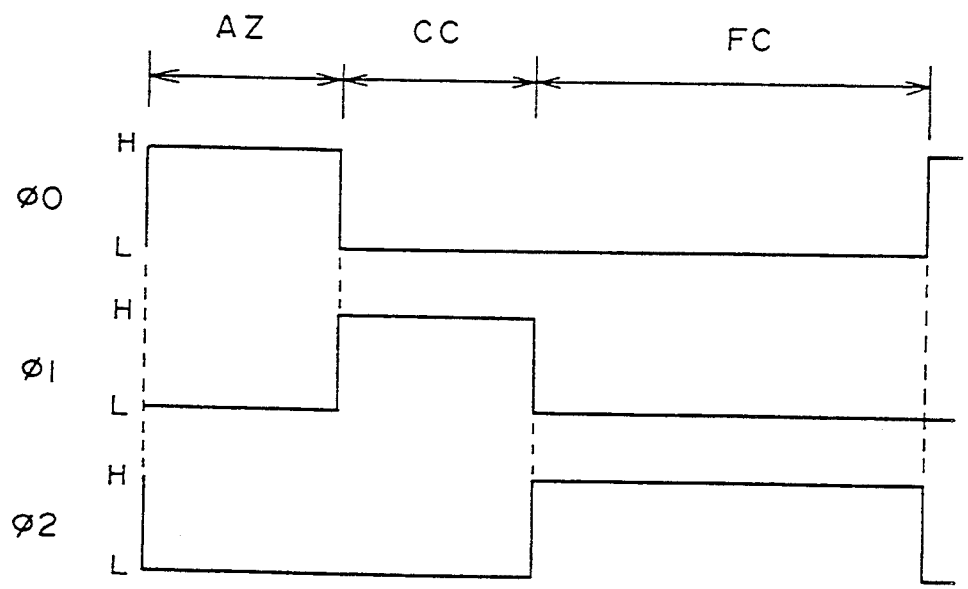
FIG. 13 is a timing chart showing operation of the voltage comparator of FIG. 12.
Figure 14:
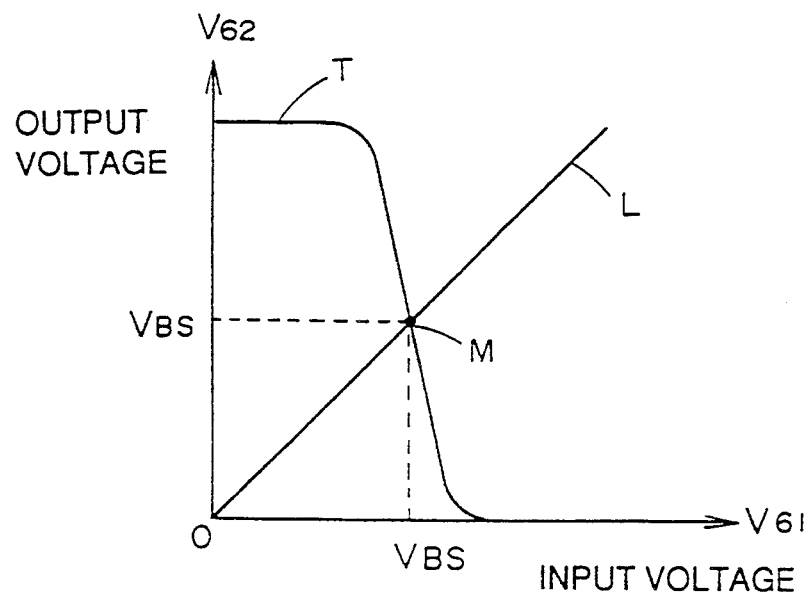
FIG. 14 is a characteristic diagram showing an input/output characteristics of an inverter of FIG. 12.
Figure 15:
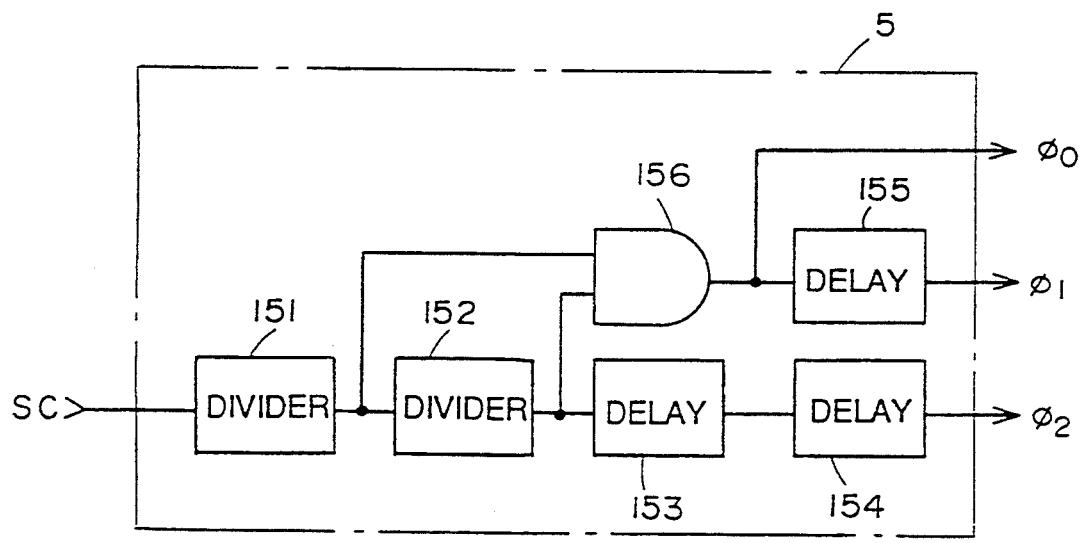
FIG. 15 is a circuit block diagram of a timing signal generator shown in FIG. 11.

The fact that the fine comparison voltage Vrf is not provided in the coarse comparison periods CC1, CC2 and CC3 brings about such advantages as set forth in the following. In the A/D converter 100, in case of multi-addressing, the signals S11' to S14' which make more than two of the switching circuits 11 to 14 turn on are provided from the encoder 3, however, these signals S11' to S14' are not applied to the switching circuits 11 to 14 as the switching control signals S11 to S14 in the coarse comparison period CC. Therefore, the problem brought about in the A/D converter 500 shown in FIG. 11 is avoided, that is, some of the nodes F11 to F43 in the reference voltage generating circuit 1 can be prevented from being shorted through one of the switching circuits 11 to 14 and a wiring circuit 2, thereby preventing unfavorable change of the coarse comparison voltage Vrc. Consequently, comparison operation by means of the correct coarse comparison voltage Vrc is performed to obtain a correct coarse comparison result.

Since the gate circuit 7 provides the signals S11' S14' as the new switching control signals S11 to S14 in the fine comparison period FC, it can be seen that the same fine comparing operation as that of the conventional A/D converter 500 shown in FIG. 11 is performed in this period FC. That is, one of the switching circuits 11 to 14 is turned on, whereby the fine reference voltage Vrf based on the coarse comparison result is applied to the voltage comparators 21 to 23.

Figure 5:
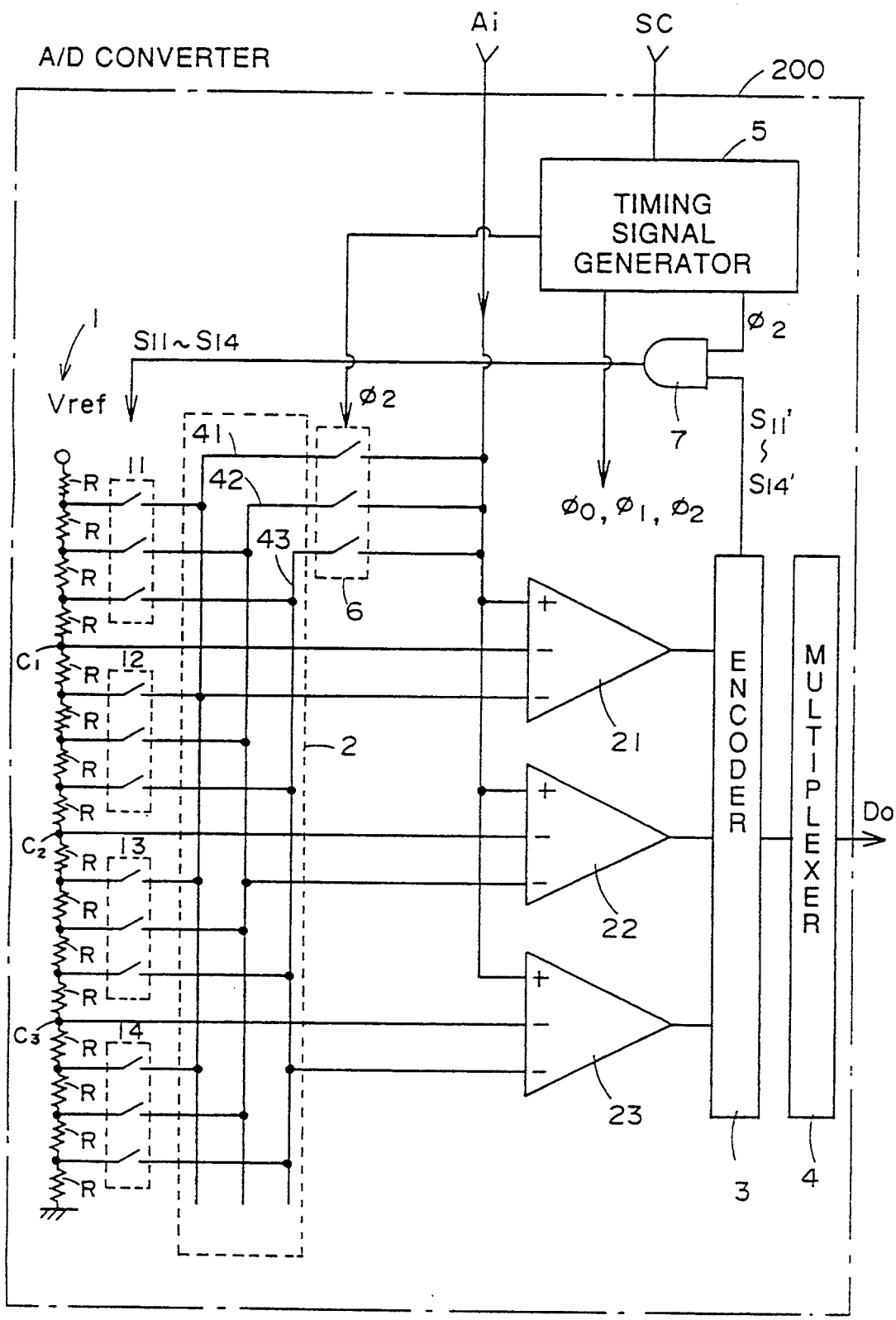
FIG. 5 is a circuit block diagram of an A/D converter showing another embodiment of the present invention.

FIG. 5 is a circuit block diagram of an A/D converter showing another embodiment of the present invention. Referring to FIG. 5, compared to the A/D converter 100 shown in FIG. 1, an A/D converter 200 is further provided with a switching circuit 6 connected to the wirings 41–43 in the wiring circuit 2. The switching circuit 6 is connected to receive the analog input signal Ai. The switching circuit 6 applies the analog input signal Ai to the wirings 41 to 43 in response to the control signal $\phi 2$ generated from the timing signal generator 5. Since other circuit structures are the same as those of the A/D converter 100 shown in FIG. 1, the explanation will not be repeated.

Figure 6:
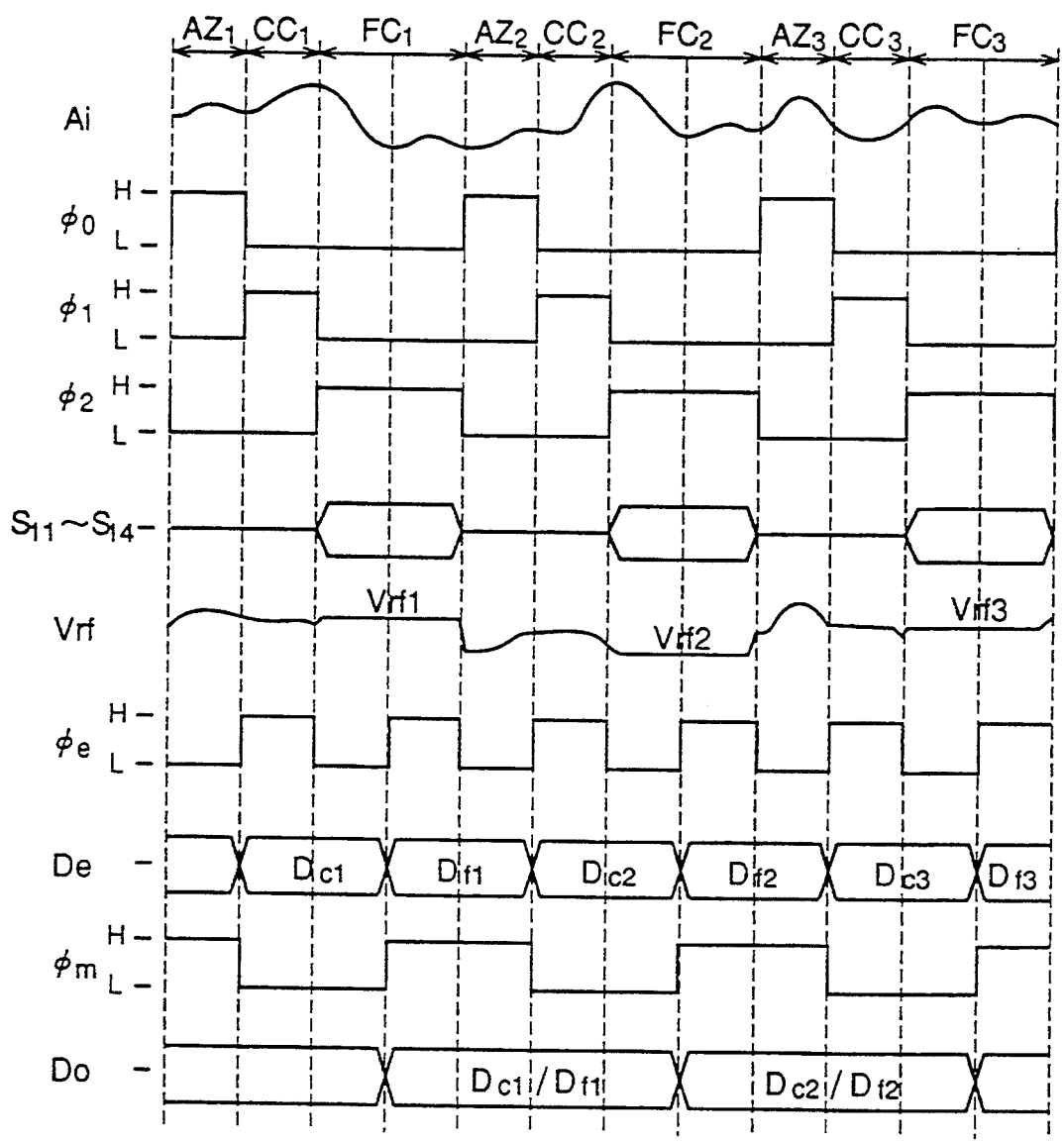
FIG. 6 is a timing chart showing the operation of the A/D converter of FIG. 5.

FIG. 6 is a timing chart showing an operation of the A/D converter shown of FIG. 5. Referring to FIGS. 5 and 6, operation of the A/D converter 200 will be described hereinafter. Since the basic operation is the same as those of the A/D converters 100 and 500 shown in FIGS. 1 and 11, the explanation will not be given, but the advantage of the provision of the switching circuit 6 will especially be described.

The gate circuit 7 as described above, prohibits the switching control signals S11 to S14 from being applied to the switching circuits 11 to 14 in the auto zero period AZ and the coarse comparison period CC. In addition, the switching circuit 6 which is newly provided applies the analog input signal Ai to the wirings 41 to 43 in the period AZ, whereby a potential of each of the wirings 41 to 43 is changed following the potential of the analog input signal Ai, resulting in the advantages as in the following.

Referring to FIG. 6, it can be seen that the fine comparison voltage Vrf changes following the potential of the analog input signal Ai in the auto zero period AZ. That is, in the periods AZ1, AZ2, and AZ3, since the switching circuit 6 shown in FIG. 5 is turned on in response to the high level signal $\phi 0$, the wirings 41 to 43 in the wiring circuit 2 are followed by the potential of the analog input signal Ai. As a result, the fine comparison voltage Vrf applied to the voltage comparators 21 to 23 in these periods AZ follows the analog input signal Ai.

When each of the comparison periods CC1, CC2 and CC3 is completed, the voltage designated by the switching control signals S11 to S14 is provided as the fine comparison voltage Vrf. For example, when the coarse comparison period CC1 is completed, the new fine comparison voltage Vrf1 is provided. In the fine comparison period FC1, fine comparison operation based on the fine comparison voltage Vrf1 is performed.

Figure 16:
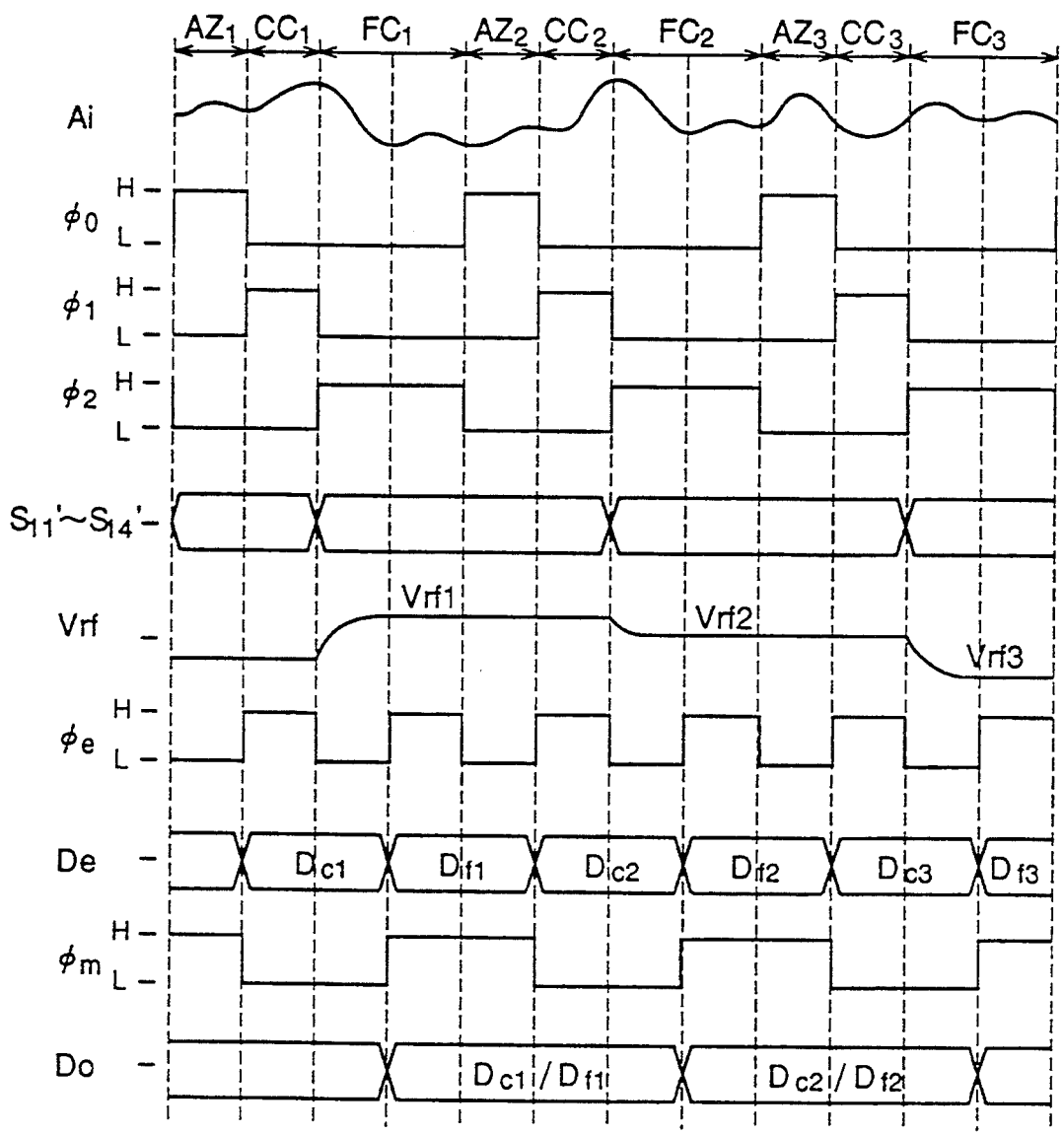
FIG. 16 is a timing chart showing the operation in the A/D converter of FIG. 11.
Figure 17:
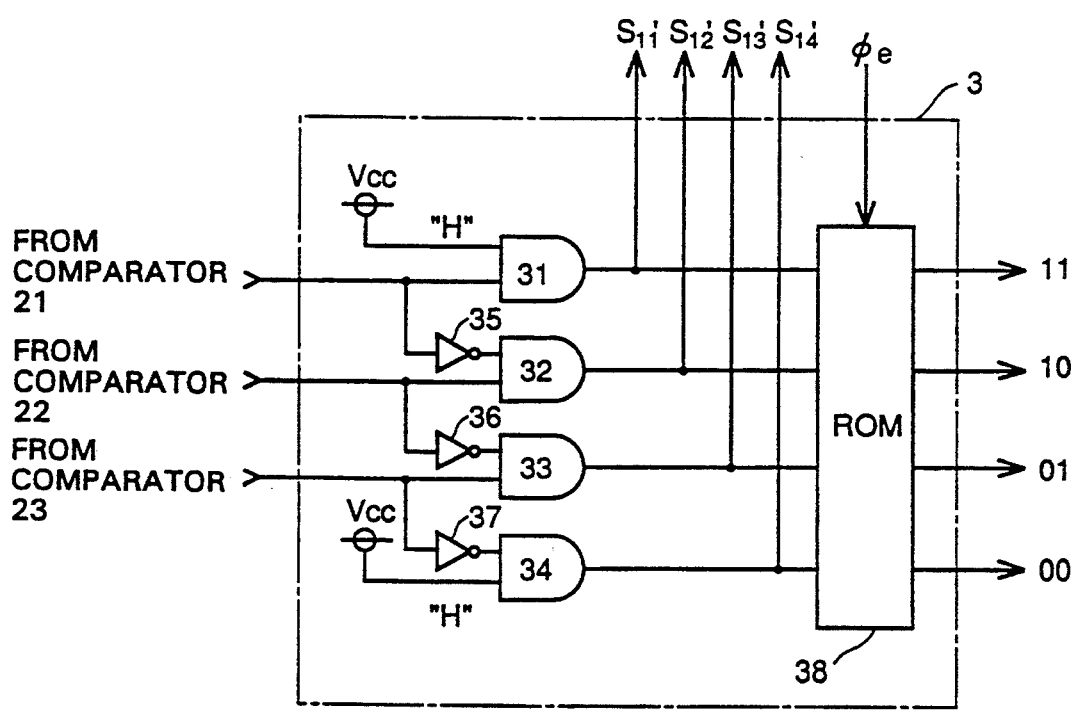
FIG. 17 is a circuit block diagram of an encoder 3 shown in FIG. 11.
Figure 18:
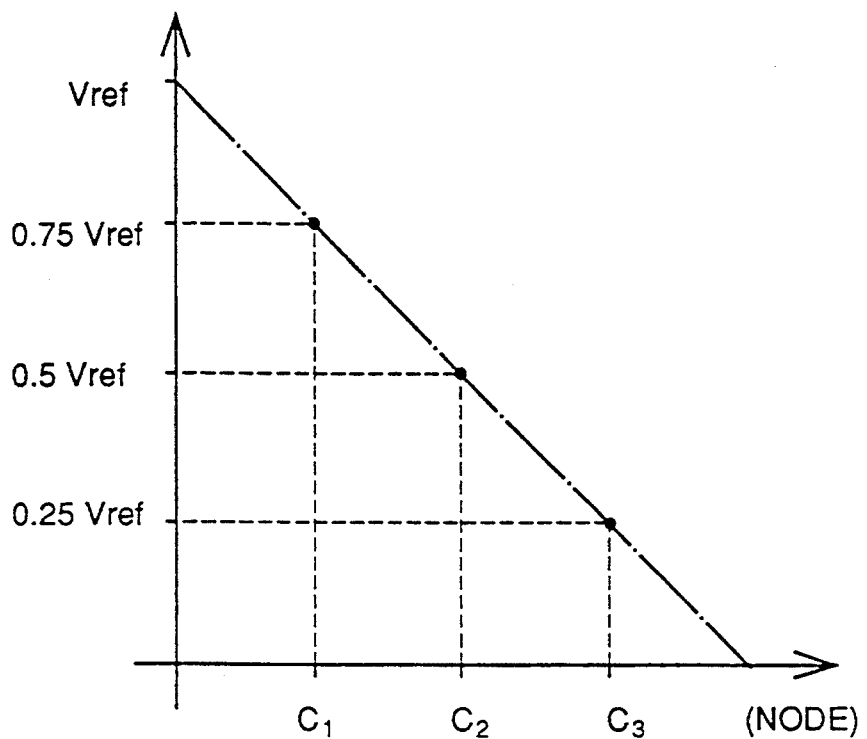
FIG. 18 is a graph showing distribution of an output voltage of a reference voltage generating circuit in normal operation.
Figure 19:
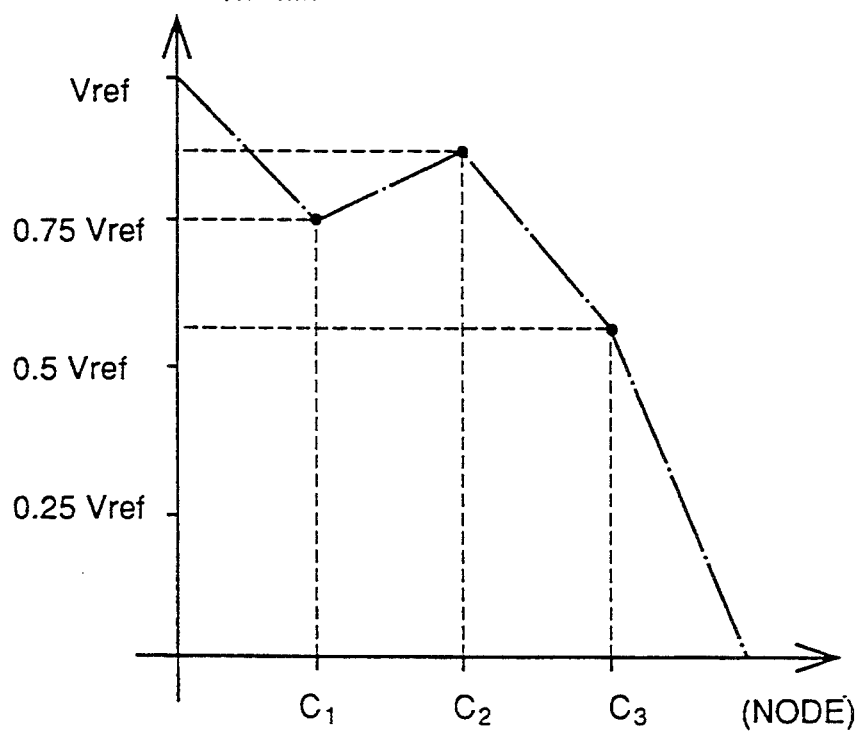
FIG. 19 is graph showing distribution of an output voltage of the reference voltage generating circuit in case of multi-addressing.

Since the fine comparison voltage Vrf applied to the voltage comparators 21 to 23 is changed from the final analog input signal potential in the auto zero period AZ, time required for the change of the fine comparison voltage Vrf is shortened. In the conventional A/D converter 500 for example, shown in FIG. 11, a large voltage difference (Vrf2-Vrf3) is produced when the fine comparison period FC3 of FIG. 16 is started. Therefore, longer time is necessary for the A/D converter 500 to establish the fine reference voltage Vrf3; however, this is improved in the A/D converter 200 shown in FIG. 5. That is, as shown in FIG. 6, when the fine comparison period FC3 begins, the fine reference voltage Vrf3 is changed from the final analog input signal potential Ai in the auto zero period Az. Since the fine reference voltage Vrf3 is selected based on the comparison result in the coarse comparison period CC3, a voltage difference (Ai-Vrf3) is smaller than the one described above (Vrf2-Vrf3). Therefore, time required for the establishment of the fine reference voltage Vrf3 is shortened. As a result, in the A/D converter 200, the fine comparison operation can be performed at a higher speed in the fine comparison period FC, which results in the improvement on the conversion rate.

Also in the A/D converter 200 shown in FIG. 5, since the switching control signals S11 to S14 are not applied to the switching circuits 11 to 14 in the auto zero period AZ and the coarse comparison period CC, the change of the coarse comparison voltage Vrc is prevented in these periods by multi-addressing. It is pointed out that the A/D converter 200 shown in FIG. 5 also has the advantage brought about in the A/D converter 100 shown in FIG. 1.

Figure 7:
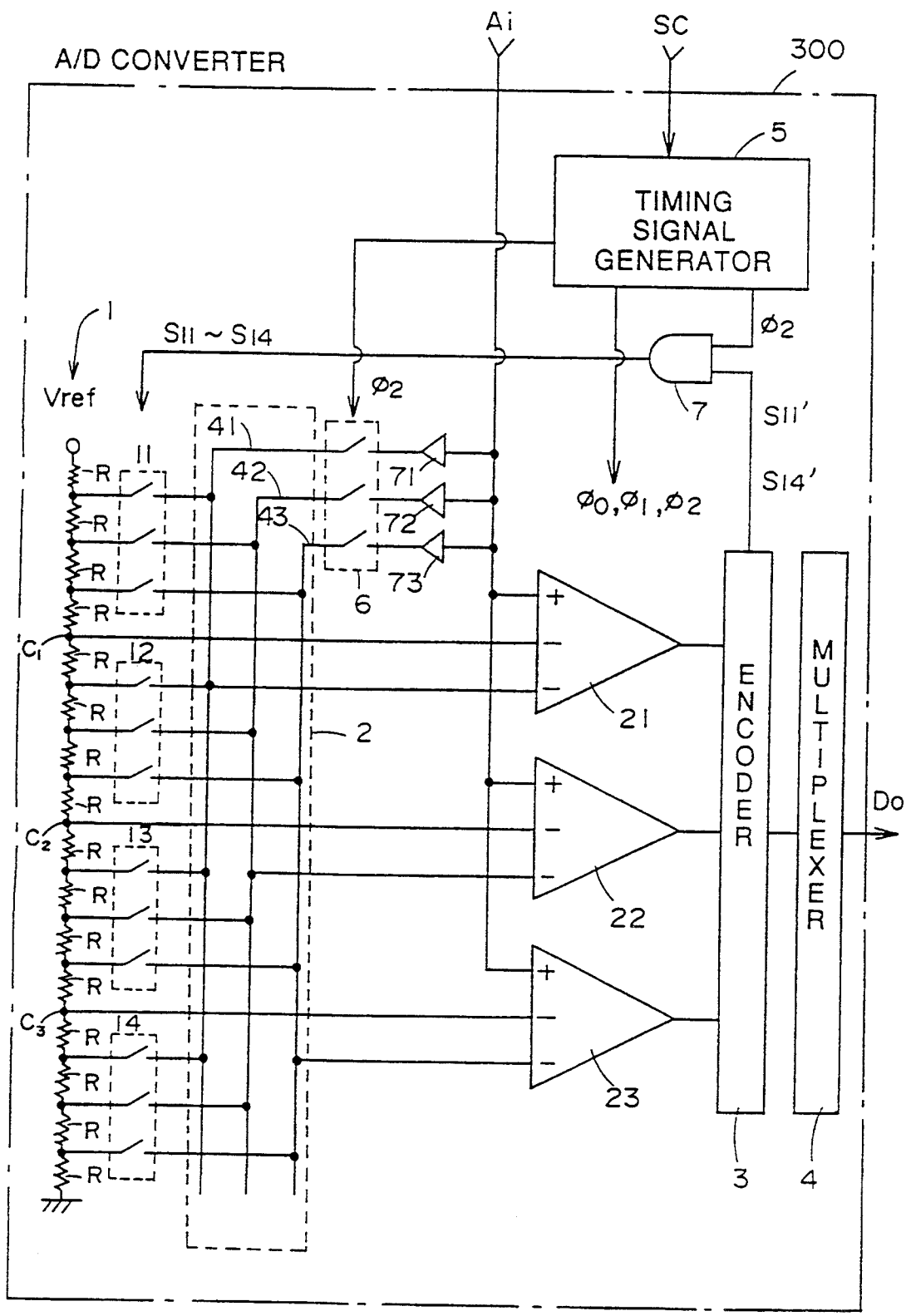
FIG. 7 is a circuit block diagram of an A/D converter showing still another embodiment of the present invention.

FIG. 7 is a circuit block diagram of an A/D converter showing still another embodiment of the present invention. Referring to FIG. 7, compared to the A/D converter 200 of FIG. 5, an A/D converter 300 further includes buffer circuits 71 to 73 provided at the preceding stage of the switching circuit 6. A potential of the analog input signal Ai is applied to the switching circuit 6 through buffer circuits 71 to 73. Since other circuit structures are the same as those of the A/D converter 200 shown in FIG. 5, the explanation will not be repeated. In addition to the advantages caused by the A/D converter 200 shown in FIG. 5, the A/D converter 300 of FIG. 7 can further bring about advantages as set forth in the following.

Generally, each of the wirings 41 to 43 in the wiring circuit 2 has capacitance to the ground. Therefore, time delay comes to be caused by driving these wirings 41 to 43 only by way of the analog input signal Ai. Since each of buffer circuits 71 to 73 shown in FIG. 7 has high input impedance and low output impedance like, for example, a source follower circuit, the influence caused by the capacitance of each of the wirings 41 to 43 can be prevented. In other words, the buffer circuits 71 to 73 are operable as impedance converting circuits. As a result, time required for the transmission of the potential of the analog input signal Ai to the wiring circuit 2 is shortened, resulting in the improvement on the conversion rate.

Figure 8:
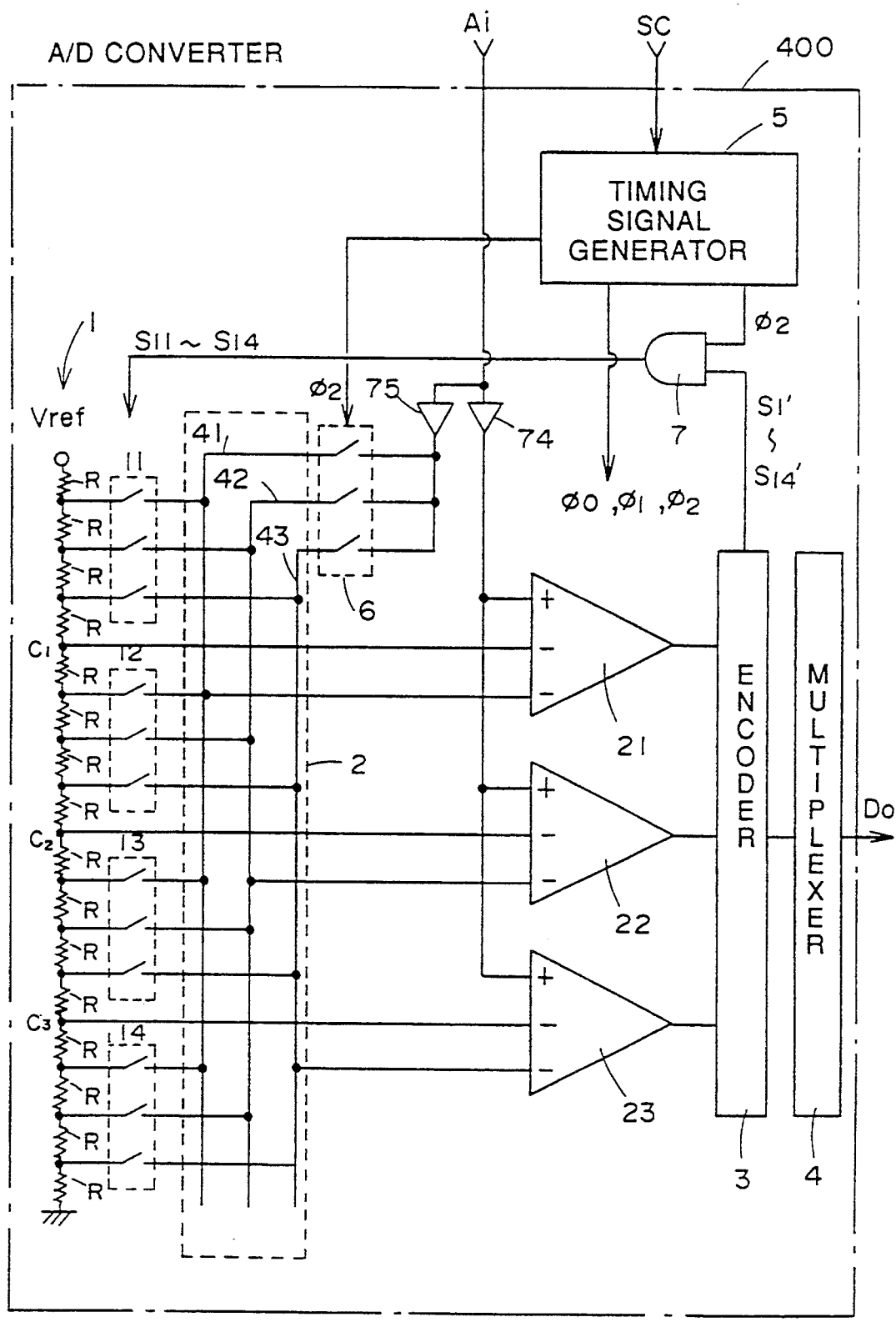
FIG. 8 is a circuit block diagram of an A/D converter showing yet another embodiment of the present invention.

FIG. 8 is a circuit block diagram of an A/D converter 400 showing yet another embodiment of the present invention. Referring to FIG. 8, compared to the A/D converter 200 of FIG. 5, the A/D converter 400 further includes a buffer circuit 74 provided at the output side of the voltage comparators 21 to 23 and a buffer circuit 75 provided at the input side of the switching circuit 6. Each of the buffer circuits 74 and 75 is connected to receive the analog input signal Ai. Each of the buffer circuits 74 and 75 is constituted, for example, by a source follower circuit, having a high input impedance and a low output impedance. Since other circuit structures are the same as those of the A/D converter 200 shown in FIG. 5, the explanation will not be repeated. The A/D converter 400 shown in FIG. 8 can further bring about the advantage as set forth in the following in addition to that in the A/D converter 300 shown in FIG. 7.

Since the analog input signal Ai is applied to the wiring circuit 2 through the buffer circuit 75, similarly to the case in the A/D converter 300 shown in FIG. 7, time required for the change of the potentials of the wirings 41 to 43 following the analog input signal Ai is shortened. Therefore, the same advantage in the increase of the speed as that in the A/D converter 300 of FIG. 7 can also be obtained in the A/D converter 400.

In addition, since the buffer circuit 74 is provided at the input side of the voltage comparators 21 to 23, a bad influence can be prevented even if the characteristics of the buffer circuits 74 and 75 are changed depending on the surrounding environment. That is, since the buffer circuits 71 to 73 are provided only at the input side of the switching circuit 6 in the A/D converter 300 shown in FIG. 7, the characteristics of the buffer circuits 71 to 73 are changed, for example, depending on the ambient temperature. Therefore, since a difference between the analog input signal Ai applied to the voltage comparators 21 to 23 and one applied to the wiring circuit 2 can be produced, potential change of the wirings 41 to 43 is poor in accuracy. However, in the A/D converter 400 shown in FIG. 8, since the buffer circuits 74 and 75 having the same circuit characteristics are provided at the input side of the voltage comparators 21 to 23 and at the input side of the switching circuit 6, respectively, bad influence caused by the change of temperature can be prevented.

Figure 9:
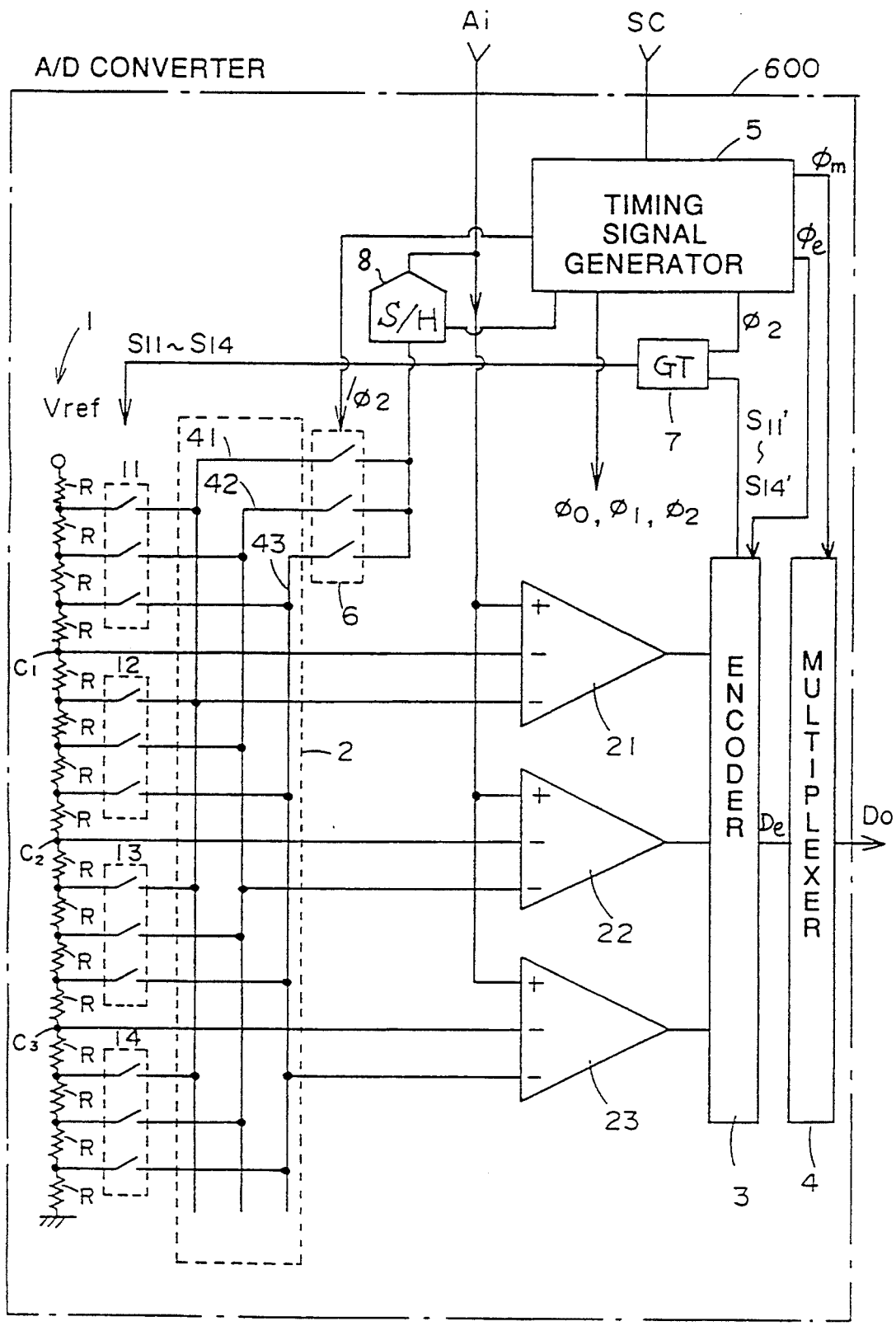
FIG. 9 is a circuit block diagram of an A/D converter showing a further embodiment of the present invention.

FIG. 9 is a circuit block diagram of an A/D converter 600 showing a further embodiment of the present invention. Referring to FIG. 9, compared with the A/D converter 200 shown in FIG. 5, the A/D converter 600 further includes a sample hold circuit (S/H) 8 connected to as to receive an analog input signal Ai. The sample hold circuit 8 responds to a control signal $\phi 0$ at a high level provided from the timing signal generator 5 to apply an output voltage Vsh following the analog input signal Ai to the switching circuit 6. When the control signal $\phi 0$ at a low level is applied, the sample hold circuit 8 holds the potential of the analog input signal Ai immediately before fall of the signal $\phi 0$ to apply the held potential to the switching circuit 6. That is, the sample hold circuit 8 applies the held voltage Vsh to the switching circuit 6 in the period the control signal $\phi 0$ is at a low level.

The switching circuit 6 responds to an inverted control signal $/\phi 2$ provided from the timing signal generator 5 to apply the voltage provided from the sample hold circuit 8 to wirings 41 to 43. Since other circuit structures are the same as those of the A/D converter 200 shown in FIG. 5, the description will not be repeated. The A/D converter 600 shown in FIG. 9 can bring about further advantages as follows, in addition to the advantages in the A/D converter 200 shown in FIG. 5.

As described above, each of the wirings 41 to 43 in the wiring circuit 2 has a capacitance for the ground. Since so much capacitance causes a delay in transmission of the analog input signal Ai, the smaller capacitance preferable. If the capacitance is too small for the ground of each of the wirings 41 to 43, however, the voltage of the analog input signal Ai can not be held in the coarse comparison period CC. More specifically, leakage of charges from each of the wirings 41 to 43 results in reduction of the voltage level of each of the wirings 41 to 43.

Figure 10:
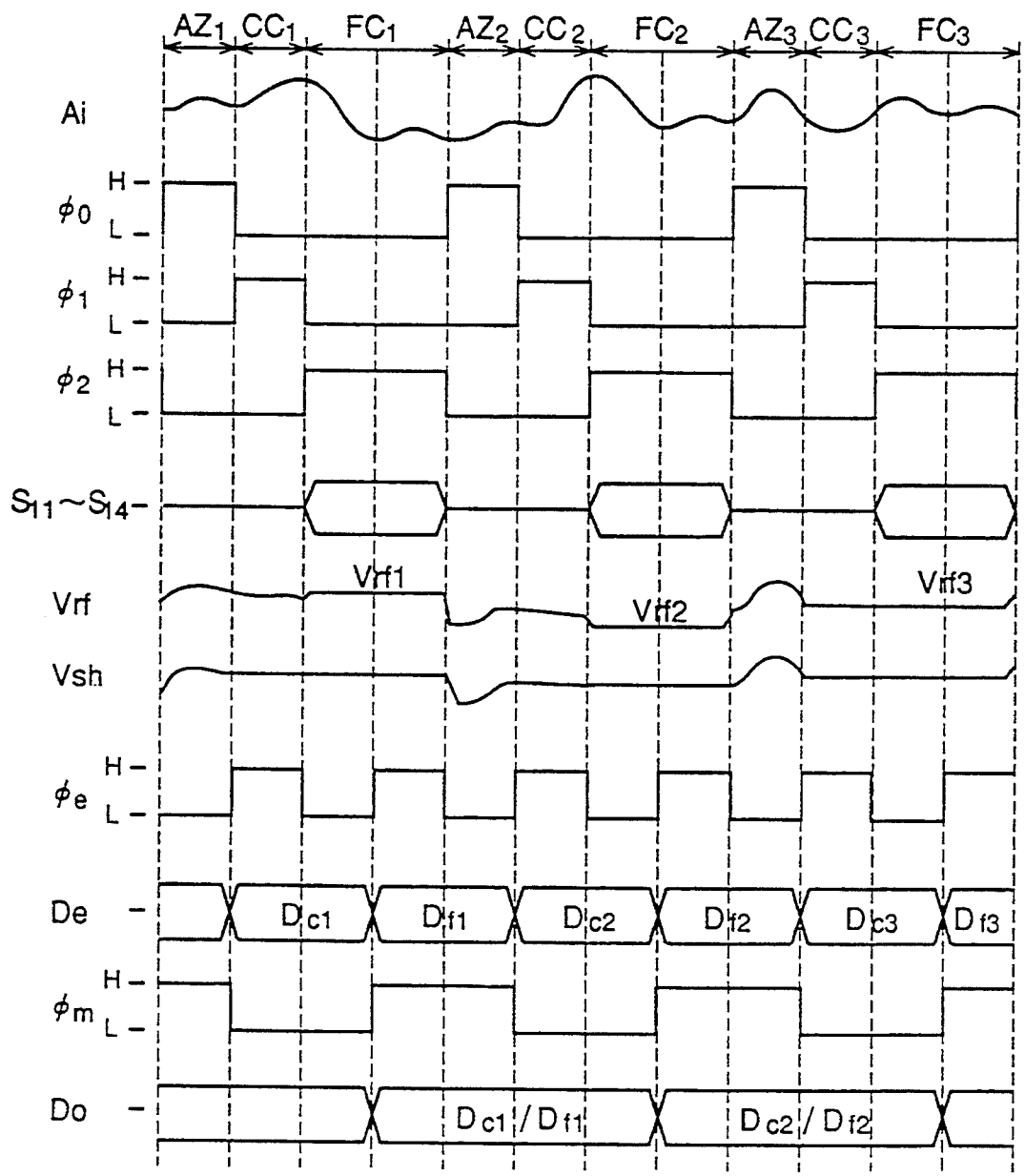
FIG. 10 is a timing chart showing an operation in the A/D converter shown in FIG. 9.

In the A/D converter 600 shown in FIG. 9, the sample hold circuit 8 is provided for preventing this problem. Referring to FIG. 10, the sample hold circuit 8 responds to the control signal $\phi 0$ at a high level to transmit the voltage of the analog input signal Ai as the output voltage Vsh in each of the auto zero periods AZ1, AZ2 and AZ3. Thus, the output voltage Vsh following the potential of the analog input signal Ai is applied to the switching circuit 6. The sample hold circuit 8 responds to the control signal $\phi 0$ at a low level to provide the final voltage in each of the auto zero periods AZ1, AZ2 and AZ3 as the output voltage Vsh. Accordingly, the final voltage in the auto zero period is held in the coarse comparison periods CC1, CC2 and CC3 and the fine comparison periods FC1, FC2 and FC3.

Consequently, even if leakage of charges from the wirings 41 to 43 occurs in the coarse comparison period CC, the sample hold circuit 8 compensates for lost charges, so that the voltage level of each of the wirings 41 to 43 can be kept at a constant level, that is, the final voltage level in each auto zero period AZ. Therefore, when each fine comparison period FC starts, time required for establishing the fine comparison voltage Vrf can be shortened, which results in a shorter time required for the fine comparison, and thus an improved conversion rate.

As described above, since the A/D converter 100 shown in FIG. 1 is provided with the gate circuit 7 prohibiting the application of the switching control signals S11 to S14 to the switching circuits 11 to 14 in the coarse comparison period CC, no switching circuits 11 to 14 are turned on in the coarse comparison period CC. Therefore, even in case of multi-addressing, since some of the nodes in the reference voltage generating circuit 1 are not shorted through the wiring circuit 2, a correct coarse comparison voltage Vrc is provided in the coarse comparison period CC. As a result, correct comparing operation in the coarse comparison period CC can be performed, whereby correct converted data Do is provided from the A/D converter 100.

In addition, since the A/D converters 200, 300 and 400 shown in FIGS. 5, 7 and 8 are provided with circuit structures to make the potentials of the wirings 41 to 43 in the wiring circuit 2 follow the analog input signal Ai in the coarse comparison period CC, time required for the establishment of the potential of the fine comparison voltage Vrf is shortened at the beginning of the fine comparison period FC, whereby time required for fine comparison is shortened, resulting in the improvement on the conversion rate. Moreover, since the A/D converter 600 shown in FIG. 9 further includes the sample hold circuit 8, reduction of the potentials of the wirings 42 and 43, and thus increase of time required for the fine comparison can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An A/D converter, comprising:
reference voltage generating means for generating a plurality of coarse reference voltages for defining a plurality of coarse voltage ranges and a plurality of fine reference voltages for defining a plurality of fine voltage ranges, each of said plurality of coarse voltage ranges including a corresponding group of said plurality of fine voltage ranges;
range detecting means for detecting a voltage range of an analog input signal potential from voltage ranges defined by applied reference voltages;
coarse voltage applying means for applying said plurality of coarse reference voltages to said range detecting means, said range detecting means detecting a coarse voltage range of the analog input signal potential based on the applied coarse reference voltages in a coarse comparison period;
fine voltage applying means responsive to said range detecting means for selectively applying to said range detecting means, the group of fine reference voltages corresponding to the coarse voltage range detected, said range detecting means detecting a fine voltage range of the analog input signal potential based on the applied fine reference voltages in a fine comparison period; and
fine voltage application prohibiting means for prohibiting the application of the fine reference voltages to said coarse reference voltages by said fine voltage applying means in said coarse voltage range comparison period.

2. The A/D converter according to claim 1, wherein said fine voltage applying means comprises a plurality of switching circuit means each receiving corresponding one of said plurality of fine reference voltage groups, and
said plurality of switching circuit means are selectively rendered conductive responsive to said range detecting means to apply the fine reference voltages included in the detected coarse range to said range detecting means.

3. The A/D converter according to claim 2, wherein said range detecting means provides switching control signals for controlling said plurality of switching circuit means as a result of the detection of said coarse voltage range,
said plurality of switching circuit means are selectively rendered conductive in response to the switching control signals.

4. The A/D converter according to claim 3, further comprising
first timing signal generating means responsive to an externally applied reference clock signal for generating a coarse comparison period signal defining said coarse comparison period, and wherein
said fine voltage application prohibiting means comprises switching control signal preventing means for preventing the application of said switching control signals to said plurality of switching circuit means in response to said coarse comparison period signal.

5. The A/D converter according to claim 4, wherein said switching control signal preventing means comprises logic product circuit means connected to receive said coarse comparison period signal and said switching control signals, and
said plurality of switching circuit means are selectively rendered conductive in response to output signals provided from said logic product circuit means.

6. The A/D converter according to claim 1, wherein said range detecting means comprises a plurality of comparison circuit means each comparing an analog input signal potential with corresponding one of applied reference voltages.

7. The A/D converter according to claim 6, wherein each of said plurality of comparison circuit means comprises
capacitor means having first and second storage electrodes and selectively receiving said corresponding one of applied reference voltages and the analog input signal potential through said first storage electrode,
inversion amplifier means connected to said second storage electrode of said capacitor means, and
a switching element connected across said inversion amplifier means and being rendered conductive in an initialization period.

8. The A/D converter according to claim 1, wherein said reference voltage generating means comprises a plurality of resistance elements connected in series between the first and second predetermined reference potentials, and each of said plurality of coarse reference voltages and of said plurality of fine reference voltages is provided through a common connection node of corresponding two adjacent resistance elements of said plurality of resistance elements.

9. An A/D converter comprising:
reference voltage generating means for generating a plurality of coarse reference voltages for defining a plurality of coarse voltage ranges and a plurality of fine reference voltages for defining a plurality of fine voltage ranges, each of said plurality of coarse voltage ranges including a corresponding group of said plurality of fine voltage ranges;
range detecting means for detecting a voltage range including an analog input signal potential from voltage ranges defined by applied reference voltages;
coarse voltage applying means for applying said plurality of coarse reference voltages to said range detecting means, said range detecting means detecting a coarse voltage range including the analog input signal potential based on the applied coarse reference voltages in a coarse comparison period;
fine voltage applying means responsive to said range detecting means for selectively applying fine reference voltages included in the coarse range detected from said plurality of fine reference voltages to said range detecting means, said range detecting means detecting a fine voltage range including the analog input signal potential based on the applied fine reference voltages in a fine comparison period;
fine voltage application prohibiting means for prohibiting the application of the fine reference voltages to said range detecting means by said fine voltage applying means in said coarse comparison period;
intermediate wiring means connected between said fine voltage applying means and said range detecting means for transmitting the fine reference voltages provided from said fine voltage applying means to said range detecting means; and
forcing means for forcing said intermediate wiring means to follow the analog input signal potential in said coarse comparison period.

10. The A/D converter according to claim 9, further comprising
second timing signal generating means responsive to an externally applied reference clock signal for generating coarse comparison period signal defining said coarse comparison period, and wherein said follower means comprises input signal potential applying means responsive to the coarse comparison period signal for applying the analog input signal potential to said intermediate wiring means.

11. The A/D converter according to claim 10, further comprising, first buffer circuit means for receiving the analog input signal potential and having a high input impedance, and wherein
said first buffer circuit means has an output node connected to an input node of said input signal potential applying means.

12. The A/D converter according to claim 11, further comprising second buffer circuit means for receiving the analog input signal potential and having circuit characteristic equivalent to that of said first buffer circuit means, and wherein said second buffer circuit means has an output node connected to an input node of said range detecting means.

13. An A/D converter comprising:
reference voltage generating means for generating a plurality of coarse reference voltages for defining a plurality of coarse voltage ranges and a plurality of fine reference voltages for defining a plurality of fine voltage ranges, each of said plurality of coarse voltages ranges including a corresponding group of said plurality of fine voltage ranges;
range detecting means for detecting a voltage range including an analog input signal potential from voltage range defined by applied reference voltages;
coarse voltage applying means for applying said plurality of coarse reference voltages to said range detecting means, said range detecting means detecting a coarse voltage range including the analog input signal potential based on the applied coarse reference voltages in a coarse comparison period;
fine voltage applying means responsive to said range detecting means for selectively applying fine reference voltages included in the coarse range detected from said plurality of fine reference voltages to said range detecting means, said range detecting means detecting a fine voltage range including the analog input signal potential based on the applied fine reference voltage in a fine comparison period;
fine voltage application prohibiting means for prohibiting application of the fine reference voltages to said range detecting means by said fine voltage applying means in said coarse comparison period;
intermediate wiring means connected between said fine voltage applying means and said range detecting means for transmitting the fine reference voltages provided from said fine voltage applying means to said range detecting means;
forcing means for forcing said intermediate wiring means to follow the analog input signal potential in an intermediate preceding period of said coarse comparison period; and
holding means for holding said intermediate wiring means at a final potential in said intermediate preceding period, in said coarse comparison period.

14. An A/D converter, comprising:
reference voltage generating means for generating a plurality of coarse reference voltages for defining a plurality of coarse voltage ranges and a plurality of fine reference voltages for defining a plurality of fine voltage ranges;
coarse range detecting means for detecting a coarse voltage range of an analog input signal potential from said plurality of coarse voltage ranges in a coarse comparison period;
fine range detecting means for detecting a fine voltage range of the analog input signal potential from the fine voltage ranges defined by fine reference voltage included in the detected coarse voltage range;
fine voltage applying means responsive to said coarse range detecting means for applying to said fine range detecting means, a fine reference voltage corresponding to the detected coarse voltage range; and
fine voltage application prohibiting means for prohibiting the application of fine reference voltages to said coarse reference voltages by said fine voltage applying means in said coarse voltage range comparison period.

15. An A/D converter operative in measurement cycles having auto-zero, coarse comparison and fine comparison periods for converting an input analog voltage to a corresponding digital code having a value corresponding to the magnitude of the input analog voltage, comprising:

means for sampling the analog input voltage during a measurement cycle;

coarse voltage range detecting means responsive to the sampling means and operative during the coarse voltage comparing period to generate a plurality of coarse voltage comparison code signals corresponding to a coarse voltage range within which the input analog voltage resides;

fine voltage range detecting means responsive to the sampling means and the coarse voltage range detecting means, and operative only during the fine voltage comparison period, to generate a plurality of fine voltage comparison codes signals corresponding to a fine voltage range within which the analog voltage resides;

fine voltage range application prohibiting means for prohibiting the application of the fine voltage range detecting means to said coarse voltage range detecting means in said coarse voltage range comparing period; and means responsive to said coarse voltage range detecting means and said fine voltage range detecting means for generating the digital code.

16. An A/D converter for converting an input analog voltage to a corresponding digital code, comprising:

means for sampling the input analog voltage;

reference voltage generating means for generating a plurality of coarse reference voltages for defining a plurality of coarse voltage ranges and a plurality of fine reference voltages for defining a plurality of fine voltage ranges;

coarse range detecting means for detecting, during a coarse comparison period, a coarse voltage range within which the sampled analog input voltage resides;

fine range detecting means for detecting, during a fine comparison period, a fine voltage range from among the fine voltage ranges defined by a fine reference voltage included in the detected coarse range within which the sampled analog input voltage resides;

fine voltage applying means responsive to said coarse range detecting means and inoperative during the coarse comparison period, for applying to said fine range detecting means, the fine reference voltages corresponding to the detected coarse voltage range detected;

fine voltage application prohibiting means for prohibiting the application of the fine reference voltages to said coarse reference voltages by said fine voltage applying means in said coarse voltage range comparison period; and means responsive to said coarse range and fine range detecting means for generating the digital code.

17. An A/D converter for converting an input analog voltage to a corresponding digital code, comprising:

means for sampling the input analog voltage;

reference voltage generating means for generating in succession a plurality of coarse reference voltages and a plurality of fine reference voltages defining successive coarse and fine comparison periods;

voltage range detecting means for detecting a voltage range corresponding to a potential of the analog input voltage sampled by said sampling means, including (a) first means responsive to the sampled input analog voltage and coarse reference voltages, and operative during the coarse comparison period, for generating a coarse voltage range signal corresponding to a coarse voltage range within which the sampled input analog signal resides, and in response, generating an address signal, and (b) second means responsive to said address signal and said sampled input analog voltage, and operative during the fine comparison period for generating a fine voltage range signal corresponding to a fine voltage range included in the coarse voltage range within which the sampled input analog signal resides;

means for precluding application of said fine reference voltages to said voltage range detecting means during the coarse comparison period; and means responsive to said coarse voltage range signal and said fine voltage range signal means for generating said digital code.

18. A method of converting an input analog voltage to a corresponding digital code, comprising the steps of:

sampling the input analog voltage during a measurement cycle;

generating a plurality of first reference voltages;

during a coarse comparison period, comparing the sampled input analog voltage with a plurality of first reference voltages to detect a coarse range within which the sampled analog input signal voltage resides;

prohibiting the application of a plurality of second reference voltages to said first reference voltages during said coarse comparison period;

during only a fine comparison period following the coarse comparison period, generating said plurality of second reference voltages;

based on said coarse range detected during the preceding step, comparing the sampled input analog voltage with selected ones of said second reference voltages to detect a fine range within which the sampled analog input signal potential resides; and generating the digital code in response to the detected coarse range and fine range.

19. An A/D converter, comprising:

means for receiving an analog input signal potential;

reference voltage generating means for generating a plurality of coarse reference voltages for defining a plurality of coarse voltage ranges covering a change in said analog input signal potential and a plurality of fine reference voltages for defining a plurality of fine voltage ranges at each of said coarse voltage ranges;

mode defining means for defining a coarse detection period and a fine detection period;

coarse voltage range detecting means for detecting in said coarse detection period a voltage range in which said analog input signal potential falls among said plurality of coarse voltage ranges defined by said coarse reference voltages;

fine voltage applying means responsive to said coarse voltage range detecting means for selectively applying fine reference voltages of said coarse voltage range detected by said coarse voltage range detecting means;

fine voltage range detecting means for detecting in said fine detection period a voltage range in which said analog input signal potential falls among said plurality of fine voltage ranges defined by said fine reference voltages of said detected coarse voltage range; and fine voltage application enabling means for enabling the application of said fine reference voltages to said fine voltage range detecting means by said fine voltage applying means only in said fine comparison period and for prohibiting the application of said fine reference voltages to said coarse reference voltages by said fine voltage applying means in said coarse voltage range comparison period.

20. An A/D converter converting an input analog voltage into a corresponding digital code, comprising:

reference voltage generating means for generating a plurality of coarse reference voltage for defining a plurality of coarse voltage ranges and a plurality of fine reference voltages for defining a plurality of fine voltage ranges;

means for sampling the input analog voltage;

coarse range detecting means responsive to the sampled voltage for providing a coarse comparison result code corresponding to the coarse voltage range including the input analog voltage in a coarse comparison period;

fine range detecting means responsive to the sampled voltage and the coarse comparison result code for providing a fine comparison result code corresponding to the fine voltage range including the input analog voltage in a fine comparison period;

fine voltage applying means responsive to said coarse range detecting means for applying to said fine range detecting means, a fine reference voltage included in said coarse voltage range detected by said coarse range detecting means only in a fine comparison period;

fine voltage application prohibiting means for application of the fine reference voltages to voltages by said fine voltage applying means in said coarse comparison period; and means responsive to said coarse comparison result code and said fine comparison result code for providing said digital code.

21. An A/D converter, comprising:

reference voltage generating means for generating a plurality of coarse reference voltages for defining a plurality of coarse voltage ranges and a plurality of fine reference voltages for defining a plurality of fine voltage ranges, each of said plurality of coarse voltage ranges including a corresponding group of said plurality of fine voltage ranges;

a plurality of voltage comparators each having first, second and third input nodes, each of said plurality of voltage comparators, in a sampling period, sampling an input analog voltage through the first input node, in a coarse comparison period, comparing the sampled voltage with a voltage applied through the second input node to provide a coarse comparison result signal, and in a fine comparison period, comparing the sampled voltage with a voltage applied through the third input node to provide a fine comparison result signal;

an encoder connected to said plurality of voltage comparators for converting the coarse comparison result signal and fine comparison result signal provided from said plurality of voltage comparators into an upper bit signal and a lower bit signal according to a predetermined rule, to provide the bit signals sequentially;

a multiplexer connected to said encoder for providing in parallel said upper bit signal and lower bit signal;

a switching circuit responsive to the coarse comparison result signal provided from said plurality of voltage comparators for selectively applying some of said plurality of fine reference voltages corresponding to the coarse comparison result to said plurality of voltage comparators; and a coarse comparison result transmitting control circuit for transmitting the coarse comparison result signal provided from said plurality of voltage comparators to said switching circuit only in the fine comparison period.

22. An A/D converter, comprising:

reference voltage generating means for generating a plurality of coarse reference voltages for defining a plurality of coarse voltage ranges and a plurality of fine reference voltages for defining a plurality of fine voltage ranges, each of said plurality of coarse voltage ranges including a corresponding group of said plurality of fine voltage ranges;

range detecting means for detecting a voltage range of an analog input signal potential from voltage ranges defined by applied reference voltages;

coarse voltage applying means for applying said plurality of coarse reference voltages to said range detecting means, said range detecting means detecting a coarse voltage range of the analog input signal potential based on the applied coarse reference voltages in a coarse comparison period;

a plurality of fine voltage applying means each responsive to said range detecting means for selectively applying to said range detecting means a corresponding one of the group of fine reference voltages corresponding to the coarse voltage range detected, said range detecting means detecting a fine voltage range of the analog input signal potential based on the applied fine reference voltages in a fine comparison period; and fine voltage application prohibiting means for prohibiting the simultaneous switching of the plurality of fine reference voltage applying means in said coarse voltage range comparison period.

* * * * *